United States Patent
Isogai et al.

(10) Patent No.: US 6,457,232 B1
(45) Date of Patent: Oct. 1, 2002

(54) JIG FOR USE IN MEASURING MOUNTING ACCURACY OF MOUNTING DEVICE AND METHOD OF MEASURING MOUNTING ACCURACY OF MOUNTING DEVICE

(75) Inventors: Takeyoshi Isogai, Hekinan; Hiroshi Katsumi, Chiryu; Masaki Murai, Nishio, all of (JP)

(73) Assignee: Fuji Machine Mfg. Co., Ltd, Aichi (JP)

( * ) Notice: Subject to any disclaimer, the term of this patent is extended or adjusted under 35 U.S.C. 154(b) by 52 days.

(21) Appl. No.: 09/693,956

(22) Filed: Oct. 23, 2000

(30) Foreign Application Priority Data

Nov. 5, 1999 (JP) ............................................ 11-315289

(51) Int. Cl.[7] .............................. H05K 3/30; G06K 9/00
(52) U.S. Cl. ........................... 29/833; 33/645; 382/151; 438/16
(58) Field of Search ........................... 33/613, 645, 573; 29/833, 825, 829, 832; 382/151, 141, 144, 145, 147; 438/16

(56) References Cited

U.S. PATENT DOCUMENTS

| | | | | |
|---|---|---|---|---|
| 4,222,036 A | * | 9/1980 | Troukens | 29/833 |
| 5,383,270 A | | 1/1995 | Iwatsuka et al. | 29/832 |
| 5,768,759 A | * | 6/1998 | Hudson | 29/833 |
| 5,992,013 A | * | 11/1999 | Morita | 29/833 |
| 6,101,709 A | * | 8/2000 | Shiota | 29/833 |
| 6,195,454 B1 | * | 2/2001 | Yazawa | 382/151 |
| 6,216,341 B1 | * | 4/2001 | Nakahara | 29/825 |

FOREIGN PATENT DOCUMENTS

| | | |
|---|---|---|
| EP | 0 326 235 A2 | 8/1989 |
| EP | 0 948 250 A1 | 6/1999 |
| JP | 4-344411 | 12/1992 |

OTHER PUBLICATIONS

U.S. patent application Ser. No. 09/524,565, Kawada, filed Mar. 13, 2000.

* cited by examiner

Primary Examiner—Christopher W. Fulton
(74) Attorney, Agent, or Firm—Oliff & Berridge, PLC

(57) ABSTRACT

A jig for use in measuring an accuracy with which a mounting device mounts at least one proper member on a proper substrate, the jig being set, in place of the proper substrate, on the mounting device, at least one standard chip being mounted on the jig by the mounting device, the jig having at least two reference marks at respective positions which assure that respective images of the reference marks and an image of at least a portion of the standard chip mounted on the jig are simultaneously taken by a single image taking device, so that the accuracy is determined based on the images taken by the image taking device.

28 Claims, 9 Drawing Sheets

JIG FOR USE IN MEASURING MOUNTING ACCURACY OF MOUNTING DEVICE AND METHOD OF MEASURING MOUNTING ACCURACY OF MOUNTING DEVICE

BACKGROUND OF INVENTION

1. Field of Invention

The present invention relates to a jig for use in measuring an accuracy with which a mounting device mounts at least one member on a substrate and a method of measuring, with the jig, the accuracy.

2. Related Art Statement

Recently, there has been a strong demand to improve an accuracy with which electric components (ECs) are mounted on a printed-wiring board (PWB), so as to meet such requirements to shorten a pitch at which each EC has its lead wires and increase a density at which the ECs are mounted on the PWB. To this end, first, it is needed to measure a positional error of each EC mounted on the PWB. An example of a positional-error measuring device is disclosed in Japanese Patent Document No. 4-344411. This positional-error measuring device includes (a) a plurality of standard chips, (b) a jig on which the chips are mounted by an EC mounting device, (c) an image taking device which takes respective images of the chips mounted on the jig, and (d) a computer which compares image data representing each of the respective images of the chips taken by the image taking device, with reference image data, and determines at least one positional error of each of the chips mounted on the jig by the EC mounting device. This positional-error measuring device may be provided as an independent device for exclusive use in measuring the positional error, or as an integral portion of the EC mounting device.

The positional-error measuring device sequentially takes the respective images of the chips mounted on the jig, compares a batch of image data representing each of the taken images of the chips, with a batch of reference image data which are prepared in advance, and determines at least one positional error of each chip. The batches of image data representing the respective images of the chips are obtained by repeating (a) feeding, relative to the image taking device, the jig in a direction parallel to the opposite major surfaces of the jig and (b) taking an image of each chip being positioned at an image-take position. However, the thus measured positional error of each chip contains not only a mounting error of the EC mounting device but also a feeding error of a feeding device which feeds the jig relative to the image taking device. To solve this problem, the feeding error of the feeding device is measured in advance, and this feeding error is subtracted from the above-indicated measured positional error, to determine finally a mounting error of the EC mounting device. More specifically described, in order to measure a feeding error of the feeding device, a jig having a reference mark is prepared, and the jig is fed by the feeding device in the same manner as that in which the images of the chips are taken, so that an image of the reference mark is taken and, based on the taken image, the feeding error of the feeding device is determined. Based on this feeding error, the above-indicated measured positional error is corrected to determine finally the mounting error of the EC mounting device.

Thus, the conventional positional-error measuring device cannot help measuring a mounting error containing a feeding error and, to avoid this problem, the feeding error is measured in advance to correct the measured mounting error. Therefore, it needs a long time to finally obtain the corrected mounting error, and it is difficult to improve the accuracy of measurement of the mounting error. Moreover, since the mounting error containing the feeding error, and the feeding error itself are measured at different times, the jig used to measure the mounting error, and the jig used to measure the feeding error may be set, on the EC mounting device, at different positions, which may lead to producing a setting error which may, in turn, be contained in the above-indicated, measured positional error.

SUMMARY OF INVENTION

The present invention provides a jig, a standard chip, a jig set, an accuracy measuring method, an accuracy-measuring-program recording medium, and a mounting apparatus which have one or more of the following technical features that are described below in respective paragraphs given parenthesized sequential numbers (1) to (27). Any technical feature that includes another technical feature shall do so by referring, at the beginning, to the parenthesized sequential number given to the latter feature. Thus, two or more of the following features may be combined, if appropriate. Each feature may be accompanied by a supplemental explanation, as needed. However, the following features and the appropriate combinations thereof are just examples to which the present invention is by no means limited. In addition, in the case where one technical feature recites a plurality of items, it is not essentially required that all of those items be simultaneously employed. That is, it is possible to select and employ only a portion (one, two, . . . , but not all) of those items of that technical feature (1) According to a first feature of the present invention, there is provided a jig for use in measuring an accuracy with which a mounting device mounts at least one proper member on a proper substrate, wherein the improvement comprises that the jig is set, in place of the proper substrate, on the mounting device, that at least one standard chip is mounted on the jig by the mounting device, and that the jig has at least two reference marks at respective positions which assure that respective images of the reference marks and an image of at least a portion of the standard chip mounted on the jig are simultaneously taken by a single image taking device, so that the accuracy is determined based on the images taken by the image taking device. The standard chip has the standard dimensions of the proper member and accordingly, when an image of at least a portion of the standard chip mounted on the jig is taken, the taken image can be used to determine the accuracy. Each proper member may be used as the standard chip, because each proper member should have the standard dimensions.

In the case where the standard chip is mounted on the jig according to the first feature (1) and the respective images of the reference marks of the jig and the image of the portion of the standard chip mounted on the jig are simultaneously taken by the single image taking device, at least one relative position of the standard chip relative to the jig can be determined and, based on the thus determined at least one relative position, at least one positional error of the standard chip relative to the jig can be determined. The at least one positional error may comprise at least one of respective positional errors of the chip relative to the jig along an X axis and a Y axis perpendicular to each other and an angular (i.e., rotation-positional) error of the chip relative to the jig about a Z axis perpendicular to the X and Y axes. The thus determined positional error of the chip does not contain the above-indicated feeding error that is contained in the mounting error measured by the conventional positional-error measuring device. Thus, owing to the jig according to the first feature (1), the mounting accuracy of the mounting device can be measured with high reliability or accuracy. In addition, since it is not needed to measure the feeding error in advance or remove the feeding error from the preliminarily measured mounting error, the mounting accuracy can be measured with high efficiency. Meanwhile, the mounting accuracy may be measured by an exclusive mounting-accuracy measuring device, independent of the mounting device, in such a manner that at least one standard chip is mounted on a jig set on the exclusive device. However, in the case where the mounting device is provided with the image taking device and a moving device which moves one of the image taking device and the jig relative to the other, the mounting device can measure its mounting accuracy. In this case, it is not needed to use the exclusive mounting-accuracy measuring device, which leads to reducing the cost needed to measure the mounting accuracy. Moreover, if an image of the chip is taken immediately after the chip is mounted on the jig, it is not needed to move one of the jig and the image taking device relative to the other, which leads to reducing the time needed to measure the mounting accuracy. The exclusive measuring device or the mounting device may be provided with not only to the first moving device which moves one of the jig and the image taking device relative to the other, but also a second moving device which moves one of jig and a holder which holds the chip, relative to the other. Although the first and second moving devices may be independent of each other, the two moving devices may be provided by a single moving device, which leads to reducing the cost needed to produce the exclusive measuring device or the mounting device.

(2) According to a second feature (2) of the present invention that includes the first feature (1), the jig has, at a plurality of locations, a plurality of groups of reference marks, respectively, each of which includes at least two reference marks.

In the case where the jig according to the second feature (2) is employed, a plurality of standard chips (e.g., a plurality of proper members) are mounted on the jig, such that each of the standard chips is associated with a corresponding one of the groups of reference marks, and the accuracy with which the each chip is mounted on the jig is measured. Thus, a mounting accuracy may be measured at each of the locations on the jig.

(3) According to a third feature (3) of the present invention that includes the first or second feature (1) or (2), the jig has, at at least four locations, at least four groups of reference marks, respectively, each of which includes at least two reference marks, the at least four locations comprising four corners of a mount area on the jig where the mounting device is allowed to mount the at least one standard chip.

In the case where the jig according to the third feature (3) is employed, four standard chips may be mounted on the jig, such that each of the standard chips is associated with a corresponding one of four groups of reference marks provided at four corners of the mount area on the jig, and the accuracy with which the each chip is mounted on the jig may be measured. Thus, a mounting accuracy may be measured at each of the four corners of the mount area on the jig. The respective accuracies measured for the four corners may be used to estimate a general tendency of mounting accuracy of the mounting device with respect to the entire mount area on the jig.

(4) According to a fourth feature (4) of the present invention that includes the third feature (3), the at least four groups of reference marks are provided at a regular interval of distance in the substantially entire mount area on the jig.

In the case where the jig according to the fourth feature (4) is employed, at least four standard chips are mounted on the jig, such that each of the standard chips is associated with a corresponding one of at least four groups of reference marks provided at the regular interval of distance in the entire mount area on the jig, and the accuracy with which the each chip is mounted on the jig are measured. Thus, a mounting accuracy is measured at each of the at least four locations regularly provided in the mount area on the jig. The respective accuracies measured for the regularly provided locations may be used to estimate a more reliable tendency of mounting accuracy of the mounting device with respect to the entire mount area on the jig.

(5) According to a fifth feature (5) of the present invention that includes any one of the first to fourth features (1) to (4), the mounting device comprises an electric-component mounting device which mounts at least one electric component as the at least one proper member, on a printed circuit board as the proper substrate. At least one electric component may be used as at least one standard chip that should have the standard dimensions of the electric component.

(6) According to a fifth feature of the present invention that includes any one of the first to fourth features (1) to (4), wherein the jig is formed of a material which has a linear expansion coefficient of not more than $20 \times 10^{-6}$. This linear expansion coefficient is expressed in terms of degrees Celsius, ° C. Though the jig may be formed of a metal having the linear expansion coefficient of not more than $20 \times 10^{-6}$, it is preferred that the jig be formed of a glass or a ceramics having the linear expansion coefficient of not more than $10 \times 10^{-6}$, more preferably of not more than $5 \times 10^{-6}$, and most preferably of not more than $2 \times 10^{-6}$.

(7) According to a seventh feature of the present invention, there is provided a standard chip for use in measuring an accuracy with which a mounting device mounts at least one proper member on a proper substrate, by setting a jig having at least two first reference marks, in place of the proper substrate, on the mounting device, wherein the improvement comprises that at least one the standard chip is mounted on the jig by the mounting device, that the standard chip has at least one positioning reference portion which is utilized by the mounting device to position the standard chip relative to the jig, when the standard chip is mounted on the jig by the mounting device, and that the standard chip has at least one second reference mark at at least one position which assures that respective images of the first reference marks of the jig and an image of the second reference mark of the standard chip mounted on the jig are simultaneously taken by an image taking device, so that the accuracy is determined based on the images taken by the image taking device.

In the case where at least one standard chip according to the seventh feature (7) is mounted on the jig according to any one of the first to sixth features (1) to (6) and the respective images of the first reference marks of the jig and the second reference mark of the standard chip mounted on the jig are simultaneously taken, the taken images can be used to determine the mounting accuracy which is not influenced by the above-indicated feeding error that is contained in the mounting error measured by the conventional positional-error measuring device. At least one proper member may be used as at least one standard chip. However, the dimensional tolerances of the proper member such as an EC are considerably large and accordingly, in the case where at least one proper member or EC is mounted as at least one standard chip on the jig to measure the mounting accuracy of the mounting device, the measured mounting accuracy may contain the dimensional errors of the proper member or EC. To avoid this problem, it is preferred to use at least one exclusive standard chip which is formed with negligible, small errors. The positioning reference portion and the second reference mark may be independent of each other, or may be integral with each other.

(8) According to an eighth feature (8) of the present invention that includes the seventh feature (7), the standard chip has a light-transmitting portion which enables the image taking device to take, in a state in which the standard chip is mounted on the jig, the images of the first reference marks of the jig through the light-transmitting portion of the standard chip.

The standard chip according to the eighth feature (8) includes the light-transmitting portion. Accordingly, in the case where the first reference marks of the jig underlie the standard chip, the image taking device can simultaneously take the respective images of the first and second reference marks. The standard chip may have its light-transmitting portion as only a portion thereof which is opposed to the first reference marks of the jig when the chip is mounted on the jig. Alternatively, the standard chip may have its light-transmitting portion as the remaining portion other than the positioning reference portion and the second reference mark.

(9) According to a ninth feature (9) of the present invention that includes the eighth feature (8), the light-transmitting portion of the standard chip is formed of a transparent material.

Alternatively, the light-transmitting portion of the standard chip may be defined by an opening which is formed through the thickness of the chip. However, in the case where the standard chip according to the ninth feature (9) is used, the chip may be entirely formed of the transparent material, and a standard icon which enables an image taking device to take n image thereof which is substantially identical with that of the proper member may be provided on one of opposite major surfaces of the transparent chip. In this case, standard chips can be easily and accurately mass-produced.

(10) According to a tenth feature (10) of the present invention that includes any one of the seventh to ninth features (7) to (9), the positioning reference portion of the standard chip comprises a standard icon which enables an image taking device to take an image of the standard icon which is substantially identical with an image, taken by the image taking device, of a positioning reference portion of the proper member.

In the case where the standard chip according to the tenth feature (10) is mounted on the jig in the same mounting operation as that carried out to mount the proper member on the proper substrate, the mounting accuracy of the mounting operation can be measured. The standard icon may be one which represents at least a portion of the proper member that is needed to position the chip relative to the jig.

(11) According to an eleventh feature (11) of the present invention that includes the tenth feature (10), the standard icon has an outline which enables the image taking device to take an image of the outline which is substantially identical with an image, taken by the image taking device, of a plurality of lead wires projecting laterally from at least one side surface of an electric component as the proper member.

(12) According to a twelfth feature (12) of the present invention that includes any one of the eighth to eleventh features (8) to (11), the standard chip has the second reference mark at the position in the light-transmitting portion thereof, such that the second reference mark of the standard chip mounted on the jig does not overlap the first reference marks of the jig.

In the case where the standard chip according to the twelfth feature (12) is mounted on the jig, the image taking device can take the respective images of the first and second reference marks in the area of the light-transmitting portion.

(13) According to a thirteenth feature (13) of the present invention that includes the twelfth feature (12), the standard chip has the light-transmitting portion thereof inside the positioning reference portion thereof.

In the case where the positioning reference portion of the standard chip is sufficiently large, the chip can have its light-transmitting portion inside its positioning reference portion.

(14) According to a fourteenth feature (14) of the present invention that includes the twelfth feature (12), the standard chip has the light-transmitting portion thereof outside the positioning reference portion thereof.

(15) According to a fifteenth feature (15) of the present invention that includes any one of the seventh to fourteenth features (7) to (14), the standard chip has the second reference mark in the positioning reference portion thereof, at the position which assures that the respective images of the first reference marks of the jig and the image of the second reference mark of the standard chip mounted on the jig are simultaneously taken by the image taking device.

The standard chip according to the fifteenth feature (15) just requires that the second reference mark should have an optical characteristic, such as a color or a brightness, different from that of the positioning reference portion as the background of the second reference mark. For example, in the case where the positioning reference portion is black, the second reference mark may be white, yellow, or transparent. Alternatively, the positioning reference portion may be provided by the light-transmitting portion which is formed of a transparent material, and the background of the transparent positioning reference portion and the second reference mark may be black.

(16) According to a sixteenth feature (16) of the present invention that includes any one of the seventh to fifteenth features (7) to (15), the second reference mark of the standard chip has a rectangular shape.

In the case where the standard chip has only one second reference mark which is rectangular or elongate, an angular error of the chip relative to the jig about an axis line such as a vertical axis line can be measured based on the respective images of the first and second reference marks. The second reference mark may be a standard icon which enables an image taking device to take an image thereof which is identical is with that of the proper member.

(17) According to a seventeenth feature (17) of the present invention that includes any one of the seventh to fifteenth features (7) to (15), the second reference mark of the standard chip has a circular shape.

(18) According to an eighteenth feature (18) of the present invention that includes the seventeenth features (17), the standard chip has a plurality of second reference marks each of which has a circular shape.

Since the standard chip according to the eighteenth feature (18) has a plurality of circular second reference marks, not only respective positional errors of the chip relative to the jig in an X-axis and a Y-axis direction perpendicular to each other on a horizontal plane, but also an angular error of the chip relative to the jig about a vertical axis line can be measured, though each second reference mark is circular. The respective images of the second reference marks and the at least two first reference marks may be simultaneously taken by the single image taking device. However, alternatively, respective images of a portion (e.g., one) of the second marks and at least one first reference mark may be taken. In the latter case, it is preferred that at least two groups of first and second reference marks be taken.

(19) According to a nineteenth feature (19) of the present invention that includes any one of the seventh to eighteenth features (7) to (18), the standard chip is formed of a material which has a linear expansion coefficient of not more than $20 \times 10^{-6}$.

Though the standard chip may be formed of a metal having the linear expansion coefficient of not more than $20 \times 10^{-6}$, it is preferred that the chip be formed of a glass or a ceramics having the linear expansion coefficient of not more than $10 \times 10^{-6}$, more preferably of not more than $5 \times 10^{-6}$, and most preferably of not more than $2 \times 10^{-6}$.

(20) According to a twentieth feature (20) of the present invention, there is provided a jig set for use in measuring an accuracy with which a mounting device mounts at least one proper member on a proper substrate, the jig set comprising a jig which is adapted to be set, in place of the proper substrate, on the mounting device; and at least one standard chip which is mounted on the jig by the mounting device, the jig having at least two reference marks at respective positions which assure that respective images of the reference marks and an image of at least a portion of the standard chip mounted on the jig are simultaneously taken by an image taking device, so that the accuracy is determined based on the images taken by the image taking device.

In the case where the jig set according to the twentieth feature (20) is used to measure the mounting accuracy, it is preferred to present, when an image of the standard chip mounted on the jig is taken, a good contrast between the chip and the jig by making, e.g., the chip black and the jig white, yellow, or transparent. The jig according to any one of the first to sixth features (1) to (6) and the standard chip according to any one of the seventh to nineteenth features (7) to (19) may be combined, as needed, to provide the jig set according to the twentieth feature (20).

(21) According to a twenty-first feature (21) of the present invention, there is provided a method of measuring an accuracy with which a mounting device mounts at least one proper member on a proper substrate, the method comprising the steps of mounting, with the mounting device, at least one proper member on a jig according to any one of the first to sixth features (1) to (6), simultaneously taking, with an image taking device, respective images of the reference marks of the jig and an image of at least a portion of the proper member mounted on the jig, and processing, with an image-data processing device, image data representing the images taken by the image taking device, to determine respective relative positions of the proper member relative to the reference marks of the jig and determine, based on the determined relative positions, at least one positional error of the proper member mounted on the jig by the mounting device.

In the mounting-accuracy measuring method according to the twenty-first feature (21), the mounting accuracy of the mounting device can be easily and accurately measured by using the jig. In particular, in the case where the image-taking step is carried out by utilizing the image-taking device which is employed for a different purpose in the mounting device, the mounting device need not employ any additional elements for measuring its mounting accuracy. However, the image-data processing device needs a modified control software or program for processing the image data representing the images taken by the image taking device.

(22) According to a twenty-second feature (22) of the present invention, there is provided a method of measuring an accuracy with which a mounting device mounts at least one proper member on a proper substrate, the method comprising the steps of mounting, with the mounting device, at least one standard chip according to any one of the seventh to nineteenth features (7) to (19), on a jig according to any one of the first to sixth features (1) to (6), simultaneously taking, with an image taking device, respective images of the reference marks of the jig as first reference marks and an image of the second reference mark of the standard chip mounted on the jig, and processing, with an image-data processing device, image data representing the images taken by the image taking device, to determine respective relative positions of the second reference mark relative to the first reference marks of the jig and determine, based on the determined relative positions, at least one positional error of the standard chip mounted on the jig by the mounting device.

(23) According to a twenty-third feature (23) of the present invention, there is provided a recording medium in which an accuracy measuring program is recorded such that the program is readable by a computer, the program comprising the steps of controlling the mounting device to mount at least one standard chip on a jig according to any one of the first to sixth features (1) to (6)), controlling a single image taking device to take simultaneously respective images of the reference marks of the jig and an image of at least a portion of the standard chip mounted on the jig, and controlling an image-data processing device to process image data representing the images taken by the image taking device, to determine respective relative positions of the standard chip relative to the reference marks of the jig and determine, based on the determined relative positions, at least one positional error of the standard chip mounted on the jig by the mounting device.

In the case where the accuracy measuring program according to the twenty-third feature (23) is entirely carried out by the mounting device, the mounting device can measure its own mounting accuracy. That is, in the case where the present program is carried out by any sort of conventional mounting device, the mounting device can measure its own mounting accuracy. The thus measured mounting accuracy may be used to evaluate the overall accuracy of the mounting device or to adjust the various parameters used in the mounting device.

(24) According to a twenty-fourth feature (24) of the present invention that includes the twenty-third feature (23), the step of controlling the mounting device comprises controlling the mounting device to mount at least one standard chip according to any one of the seventh to nineteenth features (7) to (19), on the jig, the step of controlling the image taking device comprises controlling the image taking device to take simultaneously respective images of the reference marks of the jig as first reference marks and an image of the second reference mark of the standard chip mounted on the jig, and the step of controlling the image-data processing device comprises controlling the image-data processing device to processes image data representing the images taken by the image taking device, to determine respective relative positions of the second reference mark relative to the first reference marks of the jig and determine, based on the determined relative positions, at least one positional error of the standard chip mounted on the jig by the mounting device.

(25) According to a twenty-fifth feature (25) of the present invention, there is provided a mounting apparatus for mounting at least one proper member on a proper substrate, comprising at least one holder which holds the at least one proper member; a supporting device which supports the proper substrate; a first moving device which moves at least one of the holder and the supporting device relative to the other of the holder and the supporting device; a control device which controls, according to prescribed control data, the first moving device so that the proper member held by the holder is mounted on the proper substrate supported by the supporting device; an image taking device having a field of view through which the image taking device can take an image of a local portion of the proper substrate supported by the supporting device; a second moving device which moves at least one of the supporting device and the image taking device relative to the other of the supporting device and the image taking device; a jig which is supported, in place of the proper substrate, by the supporting device, so that at least one standard chip, held by the at least one holder, is mounted on the jig, the jig having at least two reference marks at respective positions which assure that respective images of the reference marks and an image of at least a portion of the standard chip mounted on the jig are simultaneously taken by the image taking device; an image-data processing device which processes image data representing the images taken by the image taking device, and determines at least one positional error of the standard chip mounted on the jig by the mounting device; and a correcting device which corrects the prescribed control data based on the at least one positional error determined by the image-data processing device.

Since the mounting apparatus according to the twenty-fifth feature (25) carries out the mounting operation while correcting the control data based on the measured positional error, the mounting apparatus can mount, with high accuracy, the proper member or members on the proper substrate. The positional error is mainly caused by the error of actual movement amount produced by the first moving device which is controlled by the control device according to the control data. However, since the control data are corrected by the correcting device based on the measured positional error, the control device can control the first moving device according to the thus corrected control data. In the case where the present mounting device has an additional function of measuring, with an image taking device, at least one positional error of the standard chip held by the holder and correcting the control data based on the thus measured positional error of the chip held by the holder, the above-indicated positional error of the chip mounted on the jig may contain an error which is caused by the general characteristic of this function. In the latter case, therefore, the error caused by the general characteristic of the function can be reduced by correcting the control data based on the measured positional error of the chip mounted on the jig. The present mounting apparatus may carry out, in advance, an accuracy measuring operation in which at least one standard chip is mounted on each of a plurality of sorts of jigs corresponding to a plurality of sorts of proper substrates, so as to measure a positional error of the chip mounted on the each sort of jig, or obtain a correction amount for correcting the positional error. Alternatively, immediately before the mounting apparatus starts a mounting operation in which at least one proper member is mounted on each sort of proper substrate, the mounting apparatus may carry out an accuracy measuring operation in which a jig corresponding to the each sort of proper substrate is used. Moreover, the mounting apparatus may carry out an accuracy measuring operation each time proper members are successively mounted on a predetermined number of proper substrates. While the mounting apparatus may carry out an accuracy measuring operation in which a jig corresponding to each sort of proper substrate is used, the mounting apparatus may carry out an accuracy measuring operation to determine its general mounting-error tendency and correct, based on the thus determined mounting-error tendency, the control data prescribed for each sort of proper substrate.

(26) According to a twenty-fifth feature (26) of the present invention that includes the twenty-fifth feature (25), the mounting apparatus further comprises a memory which stores the at least one positional error determined by the image-data processing device, and the correcting device corrects the prescribed control data based on the positional error stored in the memory.

(27) According to a twenty-seventh feature (27) of the present invention that includes the twenty-fifth feature (25), the mounting apparatus further comprises a correction-amount determining device which determines, based on the at least one positional error determined by the image-data processing device, at least one correction amount for correcting the at least one positional error; and a memory which stores the at least one correction amount determined by the correction-amount determining device, and the correcting device corrects the prescribed control data based on the correction amount stored in the memory.

BRIEF DESCRIPTION OF DRAWINGS

The above and optional objects, features, and advantages of the present invention will be better understood by reading the following detailed description of the preferred embodiments of the invention, when considered in conjunction with the accompanying drawings, in which.

DETAILED DESCRIPTION OF PREFERRED EMBODIMENTS

Hereinafter, there will be described an electronic-component ("EC") mounting system to which the present invention is applied, by reference to the accompanying drawings. The present EC mounting system is basically similar to that disclosed in U.S. patent application Ser. No. 09/524,565 assigned to the assignee of the present application.

Figure 1:
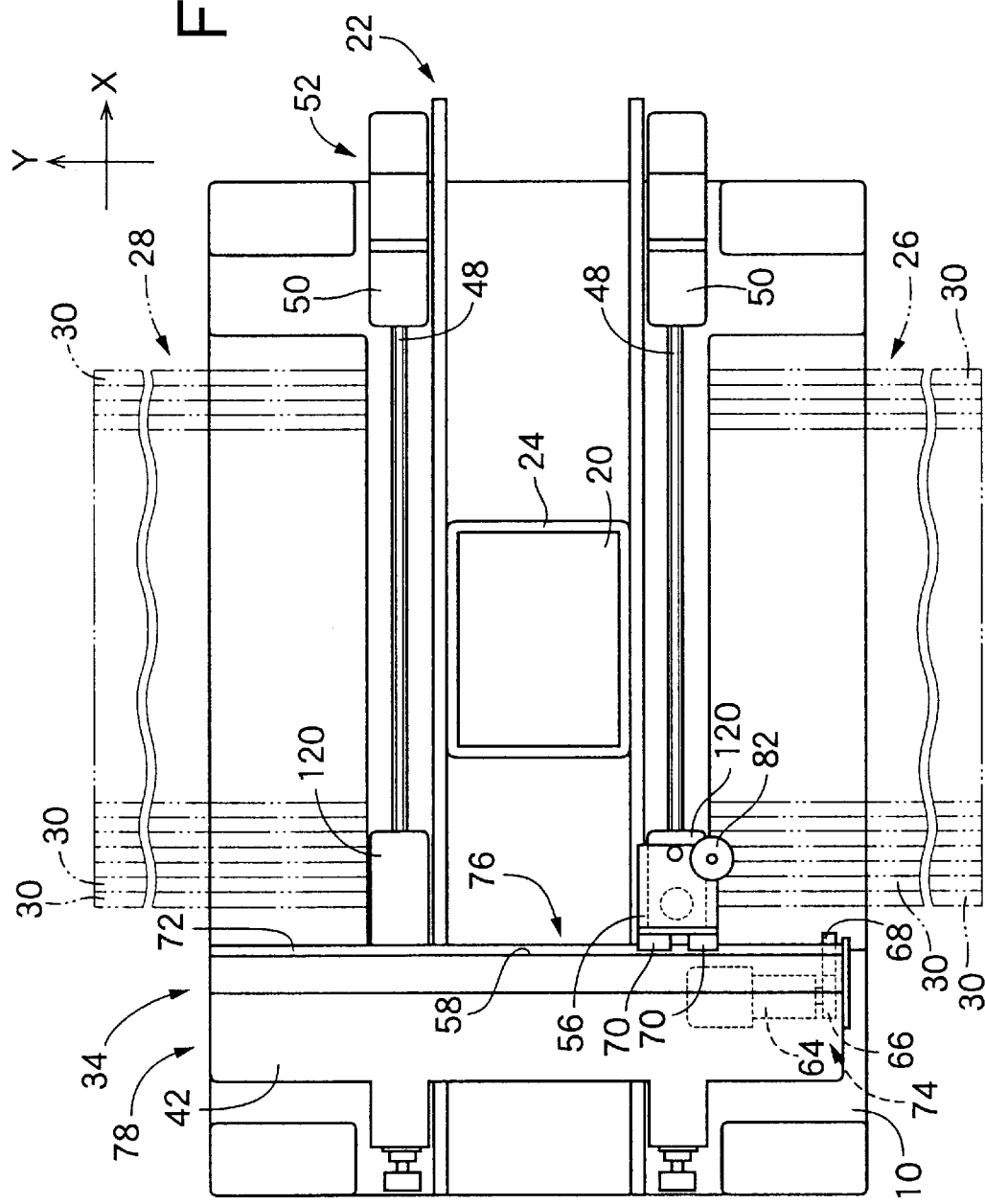
FIG. 1 is a plan view of an electric-component (EC) mounting system to which the present invention is applied.
Figure 2:
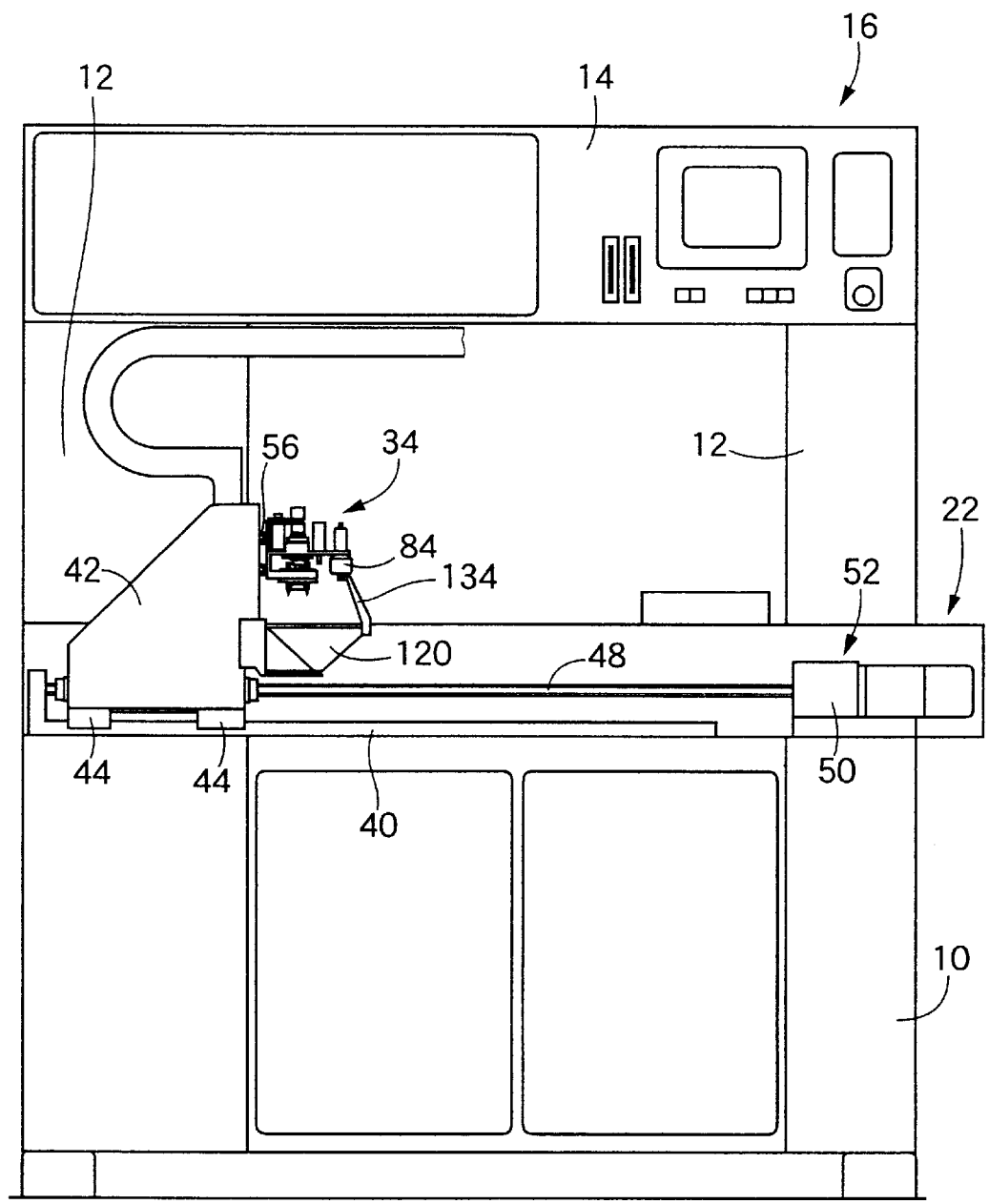
FIG. 2 is a front elevation view of the EC mounting system.

As shown in FIG. 2, the present EC mounting system includes a base 10, and a plurality of columns 12 standing on the bed 10. A stationary table 14 on which an operation panel 16 and other elements are provided is fixed to the columns 12. On the base 10, there is also provided, as shown in FIG. 1, a board conveyor 22 as a sort of board transferring device that transfers a printed-wiring board ("PWB") 20 in an X-axis direction (i.e., a left-right direction in FIGS. 1 and 2). The PWB 20 is transferred or conveyed by the board conveyor 22, and is positioned and supported, by a board supporting device 24, at a predetermined position and in a state in which the PWB 20 takes a horizontal posture.

Two feeder-type EC supplying devices 26, 28 each as a sort of EC supplying device are provided on two portions of the base 10 that are opposite to each other in a Y-axis direction perpendicular to the X-axis direction on a horizontal plane. Each of the EC supplying devices 26, 28 includes a number of EC-supply feeders 30 which are disposed in a state in which respective EC-supply portions of the feeders 30 are arranged along a reference line. In the present embodiment, the reference line is a straight line parallel to the X-axis direction. Each of the feeders 30 holds an EC carrier tape. The EC carrier tape includes an EC-accommodating tape having EC-accommodating portions or pockets which are formed at a regular interval of distance in a lengthwise direction thereof and each of which accommodates an EC; and a cover tape which is adhered to the EC-accommodating tape to cover respective upper openings of the EC-accommodating pockets thereof, thereby preventing the ECs from jumping out of the pockets when the EC carrier tape is fed. Each feeder 30 includes an EC-carrier-tape feeding device and a cover-tape taking-up device, and a drive source of those two devices. While the EC-carrier-tape feeding device feeds the EC carrier tape at a predetermine feeding pitch in the Y-axis direction, and the cover-tape taking-up device peels the cover tape off the EC-accommodating tape and takes up the cover tape around a taking-up member thereof, each of the ECs is fed to an EC-supply position in the EC-supply portion of each feeder 30.

ECs 32 (FIG. 3) which are supplied by the EC supplying devices 26, 28 are mounted on the PWB 20, by an EC mounting device 34 provided on the base 10, so as to produce a printed circuit board.

Figure 3:
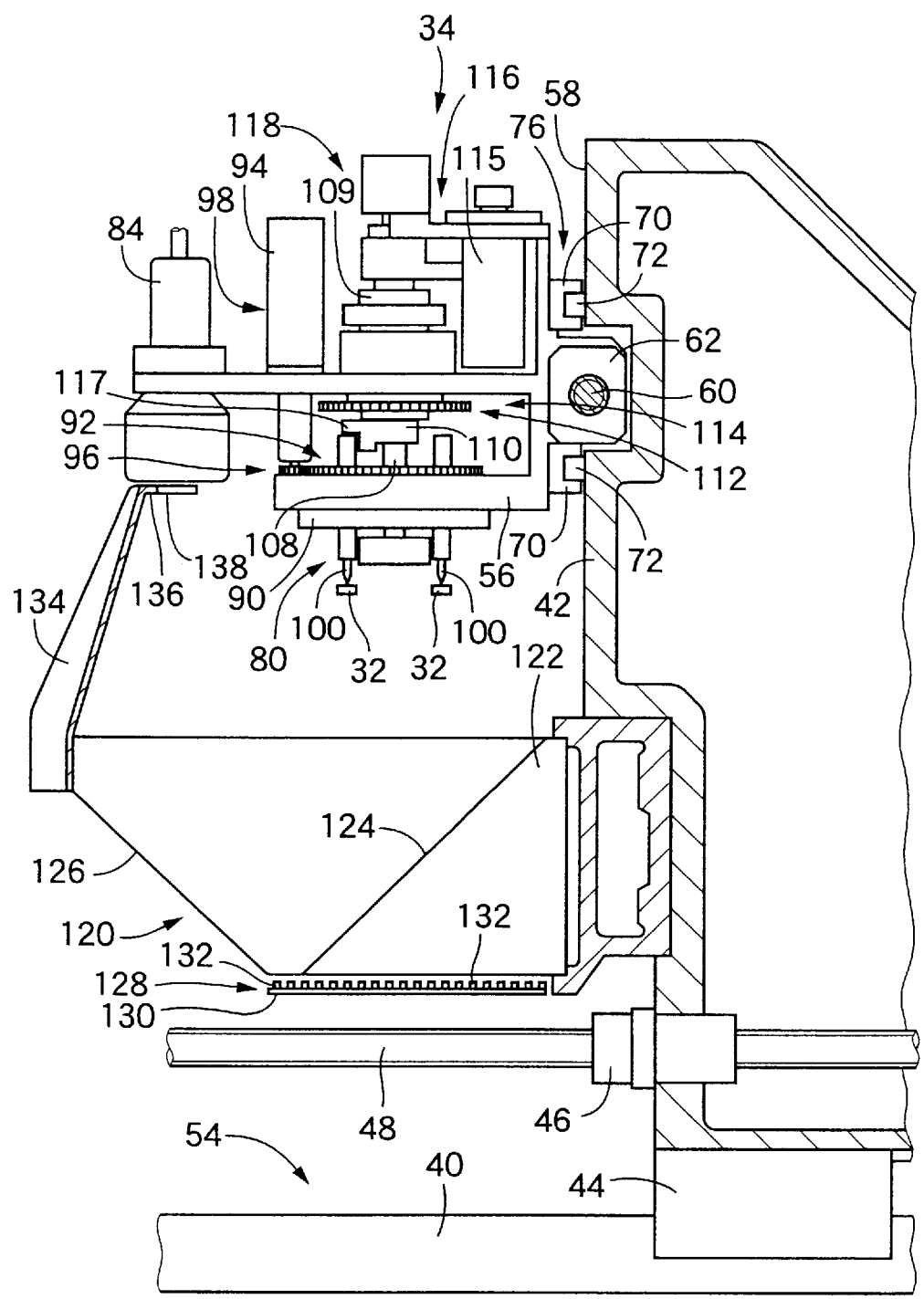
FIG. 3 is a partly cross-sectioned, front elevation view of a plurality of suction nozzles, a rotatable body, and a butting-member rotating device of the EC mounting system.

As shown in FIG. 3, two guide rails 40 which extend parallel to each other in the X-axis direction are provided, on the base 10, on both sides of the board conveyor 22 in the Y-axis direction. An X-axis slide 42 movably fits on the two guide rails 40 via respective pairs of guide blocks 44. As shown in FIG. 1, the X-axis slide 42 has a length from the one EC supplying device 26 to the other device 28 over the board conveyor 22, and two nuts 46 (only one nut 46 is shown in FIG. 3) are fixed to the X-axis slide 42. The two nuts 46 are threadedly engaged with two ball screws 48, respectively. When the two ball screws 48 are rotated in synchronism with each other by two X-axis servomotors 50, respectively, the X-axis slide 42 is moved in the X-axis direction. Thus, the nuts 46, the ball screws 48, and the X-axis servomotors 50 cooperate with each other to provide an X-axis moving device 52; and the guide rails 40 and the guide blocks 44 cooperate with one another to provide a guiding device 54 which guides the movement of the X-axis slide 42.

On the X-axis slide 42, a Y-axis slide 56 is provided such that the Y-axis slide 56 is movable in the Y-axis direction perpendicular to the X-axis direction on the horizontal plane. As shown in FIG. 3, the X-axis slide 42 has a vertical surface 58 to which a ball screw 60 which extends in the Y-axis direction is fixed, and a nut 62 fixed to the Y-axis slide 56 is threadedly engaged with the ball screw 60. When the ball screw 60 is rotated by a Y-axis servomotor 64, shown in FIG. 1, via gears 66, 68, the Y-axis slide 56 is moved in the Y-axis direction by being guided by a pair of guide blocks 70 and a pair of guide rails 72. The ball screw 60, the nut 62, and the Y-axis servomotor 64 cooperate with one another to provide a Y-axis moving device 74; and the guide blocks 70 and the guide rails 72 cooperate with each other to provide a guiding device 76 which guides the movement of the Y-axis slide 56.

The Y-axis slide 56 is composed of a plurality of members, for easier production purposes, and those members assembled with each other function as the integral Y-axis slide 56. In the present embodiment, the Y-axis slide 56 functions as a movable member; and the X-axis moving device 52, the Y-axis moving device 74, and the two guiding devices 54, 56 for guiding the respective movements of the X-axis slide 42 and the Y-axis slide 56, cooperate with one another to provide a main moving device 78. In the present embodiment, a horizontal plane is a movement plane parallel to the PWB 20, and the Y-axis slide 56 is moved on the X-axis slide 42, by the main moving device 78, in the Y-axis direction parallel to the horizontal plane and perpendicular to the X-axis direction, and is moved, relative to the PWB 20 horizontally supported by the board supporting device 24, to an arbitrary position on the horizontal plane.

The Y-axis slide 56 supports an EC mounting head 80, a first CCD (charge-coupled device) camera 82 (FIG. 1) as an image taking device that takes an image of the PWB 20, and a second CCD camera 84 as an image taking device that takes respective images of ECs 32. As shown in FIG. 3, the second CCD camera 84 is fixed to a projecting end portion of the Y-axis slide 56 that projects in the X-axis direction, such that the CCD camera 84 is aligned with the EC mounting head 80 in the Y-axis direction and is oriented downward.

The EC mounting head 80 includes a rotatable body 90. The rotatable body 90 is supported by the Y-axis slide 56, such that the rotatable body 90 is rotatable about a vertical axis line as a rotation-axis line perpendicular to the horizontal, movement plane. That is, the rotatable body 90 is rotatable about an axis line perpendicular to the PWB 20 which is horizontally supported. When the Y-axis slide 56 is moved by the main moving device 78, the rotatable body 90 is moved to an arbitrary position on the horizontal plane. Thus, the EC mounting device 34 can be said as a rotatable-body-moving-type EC mounting device.

The rotatable body 90 has a circular cross section, and a driven wheel 92 is concentrically fixed to an upper end as one of axially opposite ends of the rotatable body 90 and is meshed with a drive wheel 96 which is rotated by a rotatable-body rotating motor 94. The rotating motor 94 is supported by the Y-axis slide 56, such that the motor 94 is oriented downward. The drive wheel 96 is connected to an output shaft of the rotating motor 94. The rotation of the rotating motor 94 is transmitted to the rotatable body 90 via the drive and driven wheels 96, 92, so that the rotatable body 90 is rotated about its vertical axis line by an arbitrary angle in each of opposite directions. In the present embodiment, the driven wheel 92, the drive wheel 96, and the rotatable-body rotating motor 94 cooperate with one another to provide a rotatable-body rotating device 98 which rotates the rotatable body 90. While in the present embodiment the driven wheel 92 is provided separately from the rotatable body 90 and is fixed to the same 90, the rotatable body 90 may include a driven portion as an integral portion thereof.

The rotatable body 90 supports a plurality of (in the. present embodiment, sixteen) suction nozzles 100 at a plurality of (sixteen) positions away from the rotation-axis line of the rotatable body 90 (in the present embodiment, a plurality of positions on a circle whose center is located on the axis line of the rotatable body 90), respectively, such that each of the suction nozzles 100 is movable relative to the body 90 in an axial direction parallel to the axis line of the body 90, but is not rotatable relative to the body 90. In FIG. 3, only two nozzles 100 are shown. When the rotatable body 90 is rotated, each of the suction nozzles 100 is revolved about the axis line of the body 90, so as to be moved to an arbitrary rotation position about the axis line of the body 90. Each of the suction nozzles 100 which are supported by the rotatable body 90 such that the nozzles 100 are not rotatable relative to the body 90, takes, at different rotation positions about the axis line of the body 90, different rotation phases about an axis line of the each suction nozzle 100, respectively. The sixteen suction nozzles 100 are supported by the rotatable body 90 such that the suction nozzles 100 are angularly (in the present embodiment, equiangularly) spaced from one another. In the present embodiment, the sixteen suction nozzles 100 are of a same sort.

However, at least two suction nozzles of the plurality of suction nozzles 100 may be of different sorts which are for holding, by suction, different sorts of ECs 32 having, e.g., different shapes and/or dimensions.

Each suction nozzle 100 holds an EC 32 by using a negative air pressure supplied thereto, and releases the EC 32 when the supplying of the negative pressure thereto is stopped and a positive air pressure is supplied thereto. Each suction nozzle 100 is supplied with the negative and positive air pressure via an air-passage defining member (not shown), and a switch-valve device 101 (FIG. 4) supplies and cuts the negative and positive air pressure to and from each suction nozzle 100.

A rotatable shaft 108 is provided outside the air-passage defining member, such that the rotatable shaft 108 is concentric with the defining member and a small clearance is left between the shaft 108 and the defining member. The rotatable shaft 108 fits in a sleeve 109, such that the shaft 108 is not rotatable relative to the sleeve 109 and is movable relative to the same 109 in an axial direction of the shaft 108. The sleeve 109 is held by the Y-axis slide 56 such that the sleeve 109 is rotatable relative to the slide 56, about the same axis line as that of the rotatable body 90, and is not movable relative to the slide 56 in an axial direction of the sleeve 109. A lower end portion of the rotatable shaft 108 projects downward from the sleeve 109, and is located above the rotatable body 90. A butting member 110 as an engaging member is fixed to the lower end portion of the shaft 108.

Thus, the butting member 110 is supported by the rotatable shaft 108, such that the butting member 110 is rotatable relative to the rotatable body 90 about the axis line of the body 90 and is movable relative to the body 90 in a direction parallel to the axis line of the body 90. Though in the present embodiment the butting member 110 is provided separately from the rotatable shaft 108 and is fixed to the shaft 108, the butting member 110 may be provided as an integral portion of the shaft 108.

The sleeve 109 is provided with a driven wheel 109 which is concentric, and integral, with the sleeve 110 and which is meshed with a drive wheel (not shown) which is rotated by a butting-member rotating motor 113 (FIG. 4) which is provided on the Y-axis slide 56. The rotation of the butting-member rotating motor 113 is transmitted to the sleeve 109 via the drive wheel and the driven wheel 112, so that the rotatable shaft 108 and the butting member 110 are rotated relative to the rotatable body 90 about the axis line of the body 90 by an arbitrary angle in each of opposite directions, and thus rotated to an arbitrary rotation phase. In the present embodiment, the butting-member rotating motor 113, the driven wheel 112, the drive wheel, and the rotatable shaft 109 cooperate with one another to provide a butting-member rotating device 114 as an engaging-member rotating device.

An engaging arm as an engaging member fits on an upper end portion of the rotatable shaft 108 that projects upward from the sleeve 109, such that the engaging arm is rotatable relative to the shaft 108 and is not movable relative to the shaft 108 in an axial direction of the same 108. The Y-axis slide 56 supports a feed screw (not shown) such that the feed screw is rotatable about a vertical axis line parallel to the axis line of the rotatable body 90 and is not movable in the axial direction of the same 90. A nut is threadedly engaged with the feed screw. An end portion of the engaging arm that projects from the rotatable shaft 108 is fixed to the nut, so that the rotation of the nut is prevented and the rotatable shaft 108 is supported by the Y-axis slide 56 via the engaging arm, the nut, and the feed screw such that the rotatable shaft 108 is movable relative to the slide 56 in a direction parallel to the axis line of the rotatable body 90 and is rotatable relative to the slide 56 about the same axis line. The feed screw is rotated by rotation of a butting-member moving motor 115 that is transmitted to the feed screw via a driven pulley, a drive pulley (both are timing pulleys), and a timing belt, so that the nut or the engaging arm is moved up and down parallel to the axis line of the rotatable body 90 and the rotatable shaft 108 and accordingly the butting member 110 are moved relative to the body 90, up and down parallel to the axis line of the body 90. In the present embodiment, the rotatable shaft 108, the feed screw, the nut, the driven pulley, the drive pulley, the timing belt, and the butting-member moving motor 115 cooperate with one another to provide a butting-member moving device 116.

The butting member 110 is common to the sixteen suction nozzles 100 and includes a projecting portion 117 which extends from the rotatable shaft 108 in a radial direction of the shaft 108 to a position where the projecting portion 117 can be opposed to each of the suction nozzles 100. The projecting portion 117 can butt on each suction nozzle 100.

When the butting member 110 is rotated by the butting-member rotating device 114 to an arbitrary rotation phase about the axis line of the rotatable body 90, the projecting portion 117 is revolved to an arbitrary rotation position where the projecting portion 117 can engage, by butting, one of the sixteen suction nozzles 100 at the arbitrary rotation phase of the body 90. In addition, when the butting member 110 is lowered by the butting-member moving device 116, the butting portion 117 engages, by butting, one of the sixteen suction nozzles 100, and lowers the one nozzle 100, thereby moving the one nozzle 100 toward the board supporting device 24 or the PWB 20 supported thereon. When the butting member 110 is elevated, the one nozzle 100 is moved upward in a direction away from the board supporting device 24 by a biasing device (not shown). For sucking and holding an EC 32, the butting member 110 is lowered and elevated, in a similar manner, to move each suction nozzle 100 toward the EC 32 and permit the nozzle 100 to be moved away from the EC-supply feeder 30. In the present embodiment, the butting member 110 is vertically moved by a same stroke both in sucking and holding an EC 32 and in mounting the EC 44 on the PWB 20. In the present embodiment, the butting member 110, the butting-member rotating device 114, and the butting-member moving device 116 cooperate with one another to provide a nozzle moving device 118 which moves each suction nozzle 100 toward, and away from, the board supporting device 24 in a direction perpendicular to the horizontal, movement plane.

As shown in FIGS. 1 and 3, two prisms 120 each as a reflecting device are fixed to the X-axis slide 42 (only one prism 120 is shown in FIG. 3). The two prisms 120 are supported by a lower portion of the X-axis slide 42, at two positions which correspond, in the Y-axis direction, at the two ball screws 48 for moving the X-axis slide 42, one of which is located between the one EC supplying device 26 and the board supporting device 24, and the other of which is located between the other supplying device 28 and the supporting device 24.

The two prisms 120 have a same construction. Each prism 120 includes a casing 122 which is fixed to the X-axis slide 42, as shown in FIG. 3, and has a first reflecting surface 124 which is inclined, right below a path of movement of the EC mounting head 80 in the Y-axis direction, by about 45 degrees relative to a vertical plane including the centerline (i.e., axis line) of the rotatable body 90, and whose lower end is more distant from the X-axis slide 42 than an upper end thereof. The prism 120 additionally has a second reflecting surface 126 which is provided right below a path of movement of the second CCD camera 84 in the Y-axis direction, such that the second reflecting surface 126 is symmetrical with the first reflecting surface 124 with respect to a vertical plane. Thus, each prism 120 is opposed to the respective movement paths of the second CCD camera 84 and the rotatable body 90. Each of the reflecting surfaces 124, 126 functions as a half mirror which transmits an upward light and reflects almost all portions of a downward light from the EC mounting head 80.

As shown in FIG. 3, a front light 128 as a lighting device is attached, via an attaching member (not shown), to the X-axis slide 42, at a position below the first reflecting surface 124 of each prism 120. The front light 128 includes a PWB 130 and a number of LEDs (light emitting diodes) 132, and is provided in a horizontal posture. A light emitted by the front light 128 is transmitted through the first reflecting surface 124 to light a front surface of the EC 32, so that the second CCD camera 84 takes a front-surface image of the EC 32.

A shutter 134 is fixed to an outer side surface of the casing 122 that is opposite to the X-axis slide 42. A dimension of the shutter 134 in the Y-axis direction is equal to those of the two reflecting surfaces 124, 126. An upper portion of the shutter 134 projects upward from the casing 122, and an end portion of the upper portion is bent toward the X-axis slide 46 in a horizontal direction so as to provide a shield portion 136 which projects into a space between the second reflecting surface 126 and the second CCD camera 84. The shield portion 136 has a cutout 138 in a middle portion thereof in the Y-axis direction. Therefore, when the Y-axis slide 56 is moved in the Y-axis direction, the second CCD camera 84 is moved above the shield portion 136 and, when passing over the cutout 138, receives the light reflected by the second reflecting surface 126. A dimension of the cutout 138 in the Y-axis direction is so determined as to be equal to a length, vt, obtained as the product of a speed, v, of movement of the second CCD camera 84 in the Y-axis direction and a time, t, of exposure.

Figure 4:
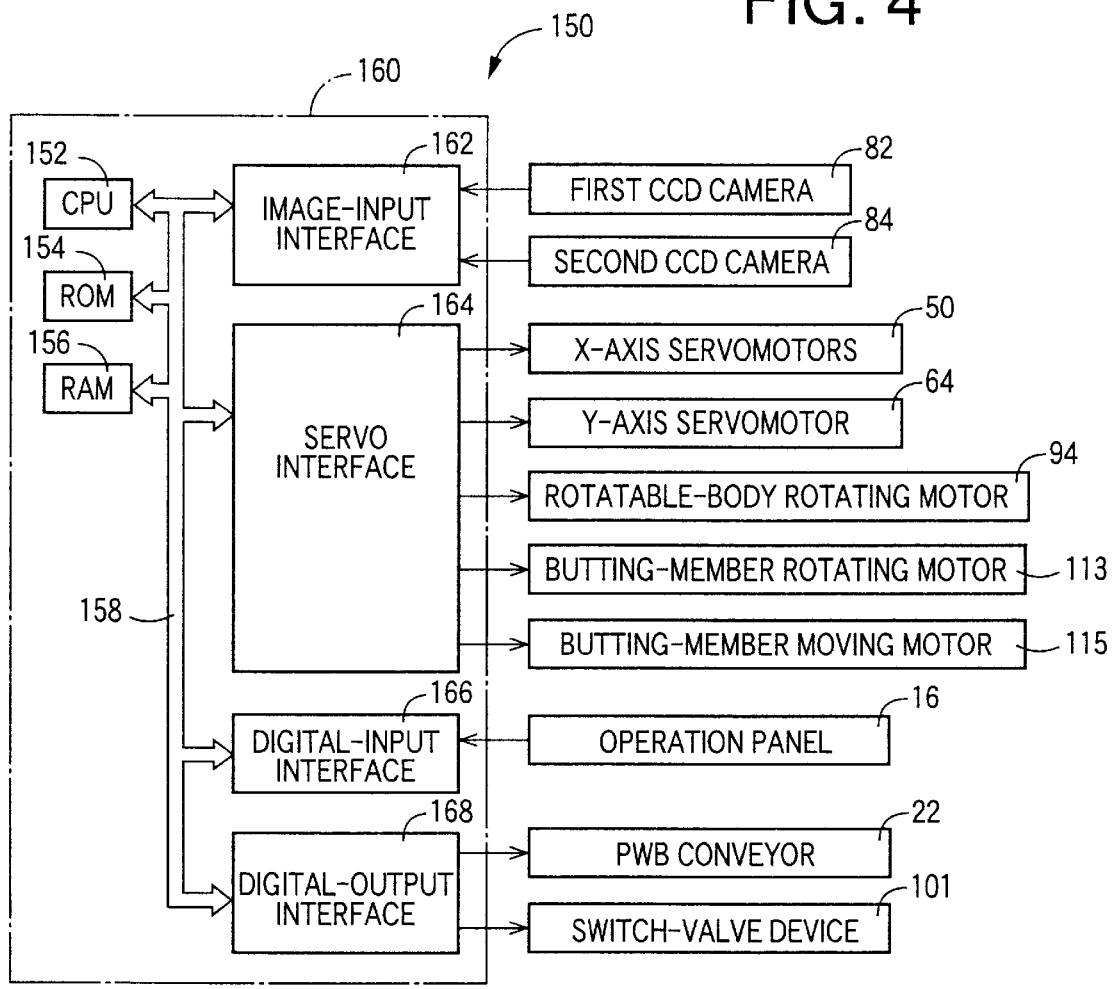
FIG. 4 is a diagrammatic view of a relevant portion of a control device of the EC mounting system.

The present EC mounting system is controlled by a control device 150 that is shown in FIG. 4. The control device 150 is essentially provided by a computer 160 including a central processing unit (CPU) 152, a read only memory (ROM) 154, a random access memory (RAM) 156, and a bus 158 which couples those elements 152, 154, 156 to one another. An image-input interface 162 is coupled to the bus 158, and the first and second CCD cameras 82, 84 are connected to the image-input interface 162. A servo interface 164 is also coupled to the bus 158, and various actuators including the X-axis servomotors 50 are connected to the servo interface 164, so that the control device 150 can control the main moving device 78, the rotatable-body rotating device 98, and the nozzle moving device 118. In addition, a digital- input interface 166 is coupled to the bus 158, and the operation panel 16 is connected to the digital-input interface 166. Moreover, a digital-output interface 168 is coupled to the bus 158, and the board conveyor 22 and the switch-valve device 101 are connected to the digital- output interface 168. In addition to the X-axis servomotors 50 and the Y-axis servomotors 64, each of the rotatable-body rotating motor 94, the butting-member rotating motor 113, and the butting-member moving motor 115 is provided by a servomotor, which is an electric rotary motor as a sort of drive source and which is accurately controllable with respect to its rotation speed and angle. A stepper motor may be used in place of each servomotor.

Figure 5:
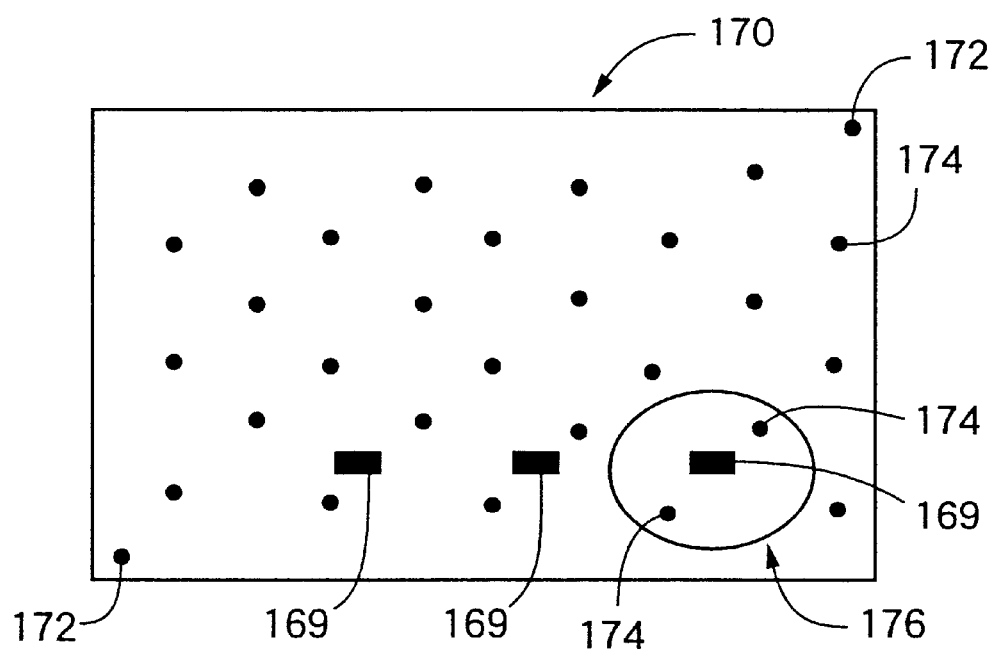
FIG. 5 is a plan view of a glass plate as a jig that is used with an EC mounting device of the EC mounting system to measure an accuracy with which the EC mounting device mounts ECs on a printed-wiring board (PWB)

The present EC mounting system measures an accuracy with which the EC mounting device 34 mounts the ECs 32 each as a proper member on the PWB 20 as a proper substrate, by mounting standard chips 169 on a glass plate 170 as a jig, shown in FIG. 5, in place of the PWB 20.

The glass plate 170 is formed of a colorless and transparent glass, and has a size not smaller than (e.g., equal to) that of the largest-size PWB 20 on which the present EC mounting system can mount the ECs 32. The glass plate 170 has a plurality of positioning fiducial marks which are provided by printing and whose images are taken before and/or after the standard chips 169 are mounted thereon, so that the taken images are used to determine the positions of the glass plate 170. In the present embodiment, the glass plate 170 has, on one major surface thereof, two positioning fiducial marks 172, each as a positioning reference mark, whose images are taken before the standard chips 169 are mounted thereon. In addition to the two positioning fiducial marks 172, the glass plate 170 has, on the same surface, a number of measuring fiducial marks 174 whose images are taken, after the standard chips 169 are mounted, together with an image or respective images of one or more of the chips 169 mounted, so that the taken images are used to measure the accuracy with which the chips 169 (i.e, the ECs 32) are mounted on the plate 170 (i.e., the PWB 20). In the present embodiment, the two positioning fiducial marks 172 (hereinafter, referred to as the positioning F-marks 172) are located at two diagonally opposite comers of the one major surface of the glass plate 170, respectively, and the numerous measuring fiducial marks 174 (hereinafter, referred to as the measuring F-marks 174) are regularly arranged in a chip-mount (i.e., EC-mount) area in which the chips 169 (i.e., the ECs 32) can be mounted on the plate 170 (i.e., the PWB 20). In the example shown in FIG. 5, the measuring F-marks 174 are located at respective lattice points, such that in a circular field of view 176 of the first CCD camera 82, two measuring F-marks 174 can be located, diametrically opposite to each other with respect to the center as a chip-mount (i.e., EC- mount) location where a chip 169 (i.e., an EC 32) is mounted. However, it is not essentially required that the two measuring F-marks 174 be diametrically opposite to each other with respect to the center, so long as the two marks 174 are located together with the one chip 169 in the circular image 176. In place of the two positioning F-marks 172, two or more measuring F-marks 174 out of all the measuring F-marks 174 may be used to determine the positions of the glass plate 170. For example, the two marks 174 which are the most distant from each other among all the marks 174 may be used for this purpose.

Next, the operation of the EC mounting system constructed as described above will be described.

When an operator commands, through operation of the operation panel 16, the present EC mounting system to measure the accuracy of mounting of ECs 32, the glass plate 170 is set on the board supporting device 24 and the standard chips 169 are mounted on the glass plate 170.

The standard chips 169 are mounted on the glass plate 170 in the same manner as that in which the ECs 32 are mounted on the PWB 20. More specifically described, first, the main moving device 78 moves the Y-axis slide 56, to move the sixteen suction nozzles 100 to the one EC supplying device 26. Then, as the rotatable body 90 is rotated, the sixteen suction nozzles 100 are sequentially moved to an EC-suck position where each nozzle 100 sucks and holds a standard chip 169. The one EC supplying device 26 includes a feeder 30 which supplies the standard chips 169 as the other feeders 30 supply the ECs 32. The suction nozzles 100 take the standard chips 169 from that feeder 30. The EC-suck position is the position on the locus of revolution of each nozzle 100 that is the nearest to that feeder 30 of the one EC supplying device 26. Before sucking the chips 169, all the sixteen suction nozzles 100 are positioned at their upper-dead positions, and each are supplied with the negative air pressure.

When each of the suction nozzles 100 takes, at the EC-suck position, a standard chip 169 by applying the negative air pressure thereto, the butting member 110 is rotated by the butting-member rotating device 114 to a rotation phase where the projecting portion 117 thereof is positioned at a first rotation position corresponding to the each nozzle 100 being positioned at the EC-suck position. Thus, the projecting portion 117 is located slightly above the each nozzle 100.

After each of the suction nozzles 100 is moved to the EC-suck position where the each nozzle 100 is positioned at a position above the EC-supply portion of the feeder 30 which supplies the standard chips 169, the butting member 110 is lowered by the butting-member moving device 116, so that the each nozzle 100 is moved toward the standard chip 169 supplied by the feeder 30. After the lower end of the each nozzle 100 contacts the chip 169, the each nozzle 100 is further lowered by a small distance, so that the each nozzle 100 surely contacts the chip 169. Irrespective of whether the each nozzle 100 is positioned at its upper-dead or lower-dead position, the nozzle 100 is supplied with the negative air pressure, so that the nozzle 100 can keep holding the chip 169.

The sixteen suction nozzles 100 are sequentially moved to the EC-suck position where each nozzle 100 sucks a standard chip 169. During this, the butting member 110 remains, relative to the each nozzle 100 being positioned at the EC-suck position, in the state in which the projecting portion 117 thereof is positioned at the rotation phase corresponding to the first rotation position. After all the suction nozzles 100 suck and hold respective standard chips 169, those nozzles 100 are moved to the glass plate 170 by the main moving device 78, so as to mount the chips 169 at predetermined chip-mount places on the plate 170. The sixteen suction nozzles 100 are moved to the Chip-mount places on the glass plate 170, by the respective movements of the X-axis and Y-axis slides 42, 56. During this, the nozzles 100 pass through above the one prism 120 fixed at a position between the EC-supply portion of the feeder 30 and the chip-mount places on the glass plate 170.

The light emitted by the front light 128 to form a front-surface image of each standard chip 169, is reflected by the first reflecting surface 124 and then is reflected upward by the second reflecting surface 126. When the EC mounting head 80 including the rotatable body 90 and the sixteen suction nozzles 100 passes through above the one prism 120, the sixteen nozzles 100 holding the respective standard chips 169 move above the first reflecting surface 124 while the second CCD camera 84 moves above the second reflecting surface 126. The two reflecting surfaces 124, 126 cause the respective lights reflected from all the sixteen chips 169 to be incident to the image-take surface of the second CCD camera 84 through the recess 138 formed in the shield portion 136 of the shutter 134, so that the second CCD camera 84 simultaneously takes, based on those image-forming lights, respective images of all the sixteen chips 169 held by the sixteen nozzles 100. Thus, the second CCD camera 84 takes the images of the chips 169 while the camera 84 is moved with the rotatable body 90.

Based on the taken images, the computer 160 calculates center-position errors, $\Delta X$, $\Delta Y$, and a rotation-position error, $\Delta \Theta$, of each of the standard chips 169. The center-position errors, $\Delta X$, $\Delta Y$ are respective positional errors of the center position of the each chip 169 in the X-axis and Y-axis directions on the horizontal plane parallel to the glass plate 170. The rotation-position error is an angular error of the each chip 169 about a vertical axis line thereof. In addition, the computer 160 calculates, in advance, respective positional errors, $\Delta X'$, $\Delta Y'$, of the glass plate 170 in the X-axis and Y-axis directions on the horizontal plane parallel to the plate 170, based on the respective images of the two positioning F-marks 172 taken by the first CCD camera 82.

The center-position errors $\Delta X$, $\Delta Y$ of each of the standard chips 169 and the positional errors $\Delta X'$, $\Delta Y'$ of the glass plate 170 are corrected by correcting the respective movement distances of the Y-axis slide 56 as the movable member in the X-axis and Y-axis directions. The rotation-position error $\Delta \Theta$ is corrected by rotating the rotatable body 90.

While the rotatable body 90 is rotated to revolve the suction nozzles 100, the butting member 110 is rotated by the butting-member rotating device 114, so that the projecting portion 117 of the butting member 110 is revolved to a second rotation position corresponding to one suction nozzle 100 holding the chip 169 to be mounted next, so that the projecting portion 117 is aligned with the one nozzle 100.

After the standard chip 169 held by the one nozzle 100 is moved to a position right above a corresponding chip-mount place on the glass plate 170 and the projecting portion 117 of the butting member 110 is revolved to a rotation phase corresponding to the second rotation position, the butting member 110 is lowered. During this, first, the butting portion 117 contacts the one nozzle 100, lowers the one nozzle 100, and thereby moves the one nozzle 100 toward the board supporting device 24, so that the standard chip 169 is mounted on the glass plate 170. From the state in which the chip 169 contacts the plate 170, the butting member 110 is further lowered by a small distance, so that the chip 169 is assuredly mounted on the plate 170.

While the one nozzle 100 is lowered, the one nozzle 100 is supplied with the negative air pressure. Immediately before the standard chip 169 contacts the glass plate 170, the supplying of the negative air pressure to the one nozzle 100 is stopped, and the supplying of the positive air pressure to the one nozzle 100 is started, so that the chip 169 is positively released from the one nozzle 100.

Similarly, regarding the standard chip 169 to be next mounted on the glass plate 170, the center-position and rotation-position errors of the chip 169 are corrected by the movement of the Y-axis slide 56 and the rotation of the rotatable body 90, so that the chip 169 having a predetermined rotation position is positioned at above a corresponding chip-mount place on the glass plate 170. In addition, the butting member 110 is rotated by the butting-member rotating device 114, and accordingly the butting portion 117 is revolved to the rotation phase corresponding to the second rotation position where the butting portion 117 is aligned with one suction nozzle 100 which will next mount the standard chip 169 on the glass plate 170. When the butting member 110 is lowered, the one nozzle 100 is lowered, so that the next chip 169 is mounted on the plate 170 and the switch valve device 101 is switched to stop supplying the negative air pressure and start supplying the positive air pressure.

After all the suction nozzles 100 mount the respective standard chips 169 on the glass plate 170, the mounting head 80 is moved to the one EC supplying device 26 to take additional standard chips 169 from the same 26.

The above-described mounting operation is repeated, so that the standard chips 169 are mounted at all the predetermined chip-mount places on the glass plate 170. Then, the first CCD camera 82 takes respective images of all the chips 169 mounted on the plate 170. Thus, the computer 160 determines respective actual mount places where the chips 169 are actually mounted and, based on the thus determined actual mount places, determines the accuracy of mounting of the chips 169. In the present embodiment, the first CCD camera 82 takes respective images of the positioning F-marks 172, the standard chips 169 mounted on the glass plate 170, and the measuring F-marks 174. In the present embodiment, a predetermined number, N, of standard chips 169 are regularly mounted in the entire chip-mount area on the glass plate 170, where the chips 169 can be mounted, and the accuracy of mounting of the chips 169 is determined or measured (only three standard chips 169 are shown in FIG. 5). However, the accuracy of mounting of the chips 169 (or the ECs 32) may be measured by mounting only one standard chip 169 on the glass plate 170, or mounting four chips 169 at four corners of the plate 170, respectively.

Next, there will be described a manner in which the present EC mounting system measures its own mounting accuracy.

Figure 6:
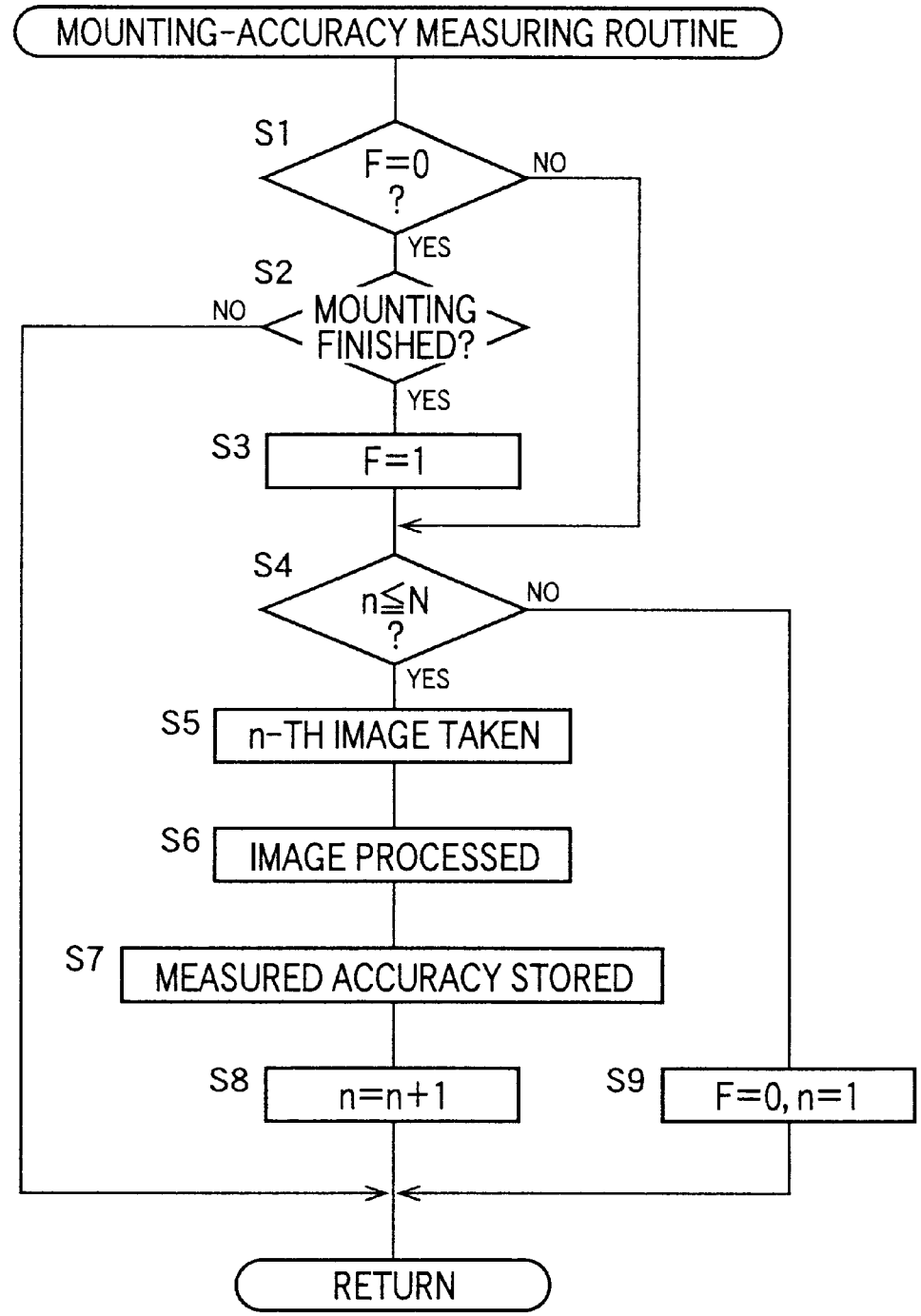
FIG. 6 is a flow chart representing a mounting-accuracy measuring program according to which the control device controls the EC mounting device to measure the mounting accuracy thereof.

FIG. 6 shows a flow chart representing a mounting accuracy measuring program according to which the control device 150 operates for measuring a mounting accuracy of the EC mounting system. When an operator inputs, through the operation panel 16, a command to carry out a mounting-accuracy measuring operation, the control device 150 iteratively executes the measuring program until the control device 150 finishes the measuring operation. This measuring program is pre-stored in the ROM 154.

First, the gist of the mounting-accuracy measuring program or operation will be briefly described below.

This control program is not executed before all the standard chips 169 are mounted on the glass plate 170. After the finishing of mounting of the chips 169 is recognized, the control device 150 starts executing this program to measure a mounting accuracy of the EC mounting system. More specifically described, when the mounting of the chips 169 is finished, the control device 150 outputs a mounting-finish signal indicating the finishing of mounting of the chips 169. After all the standard chips 169 are mounted on the glass plate 170 by the EC mounting system, the first CCD camera 82 simultaneously takes respective images of each of the standard chips 169 mounted on the glass plate 170 and a predetermined number of measuring F-marks 174 associated with the each chip 169. The first CCD camera 82 sequentially takes the respective images of all the predetermined number, N, of standard chips 169 mounted on the glass plate 170, and the control device 150 calculates, based on each of respective batches of image data representing the thus taken images, an accuracy of mounting of each chip 169 at its corresponding chip-mount place on the glass plate 170, and stores the thus calculated mounting accuracies in the RAM 156. In the present embodiment, the computer 160 stores the mounting accuracy of each chip 169 in relation with the corresponding chip-mount place where the each chip 169 is mounted on the glass plate 170. Thus, the mounting-accuracy measuring operation is ended.

Next, the mounting-accuracy measuring program will be described in detail by reference to the flow chart shown in FIG. 6.

When the operator inputs, through the operation panel 16, a command to start a mounting-accuracy measuring operation, first, the control device 150 carries out Step SI to judge whether a flag, F, is set at F=0 indicating that the finishing of mounting of the standard chips 169 has not been confirmed. On the other hand, F=1 indicates that the finishing of mounting of the standard chips 169 has been confirmed. At the initial control cycle, the flag F is set at its initial value, F=0, and accordingly a positive judgment is made at Step S1. Hence, the control of the control device 150 goes to Step S2 to judge whether the mounting-finish signal has been outputted. If a negative judgment is made at Step S2, the current control cycle according to the present control program is ended. On the other hand, if a positive judgment is made at Step S2, the control goes to Step S3 to set the flag F to F=1.

Next, the first CCD camera 82 takes respective images of each of the standard chips 169 mounted on the glass plate 170 and its corresponding two measuring F-marks 174.

More specifically described, at Step S4, the control device 150 judges whether a sequential number, n, assigned to the current chip-mount place where an image of the chip 169 mounted there on the glass plate 170 is currently taken by the first CCD camera 82, is not greater than the predetermined number, N, assigned to the last chip-mount place on the plate 170. Thus, the control device 150 judges whether the first CCD camera 82 has finished taking the respective images of all the chips 169 and their corresponding measuring F-marks 174. A positive judgment made at Step S4 indicates that the CCD camera 82 has not finished taking all the images; and a negative judgment indicates that the CCD camera 82 has finished taking all the images. The sequential numbers n assigned to all the chip-mount places on the glass plate 170 indicate the order in which the CCD camera 82 takes the respective images of the chips 169, and change from the first number, 1, to the last number, N, that is equal to the total number, N, of the chips 169 mounted on the glass plate 170. At the initial control cycle, no images have been taken and accordingly the number, n, remains at n=1, so that a positive judgment is made at Step S4 and the control goes to Step S5. At Step S5, the first CCD camera 82 takes respective images of the standard chip 169 mounted at the current chip-mount place numbered n (n=1) and its corresponding two measuring F-marks 174. Step S5 is followed by Step S6 to process image data representing the images taken at Step S5 and determine a mounting accuracy at the current chip-mount place numbered n. Next, at Step S7, the control device 150 or the computer 160 stores the thus determined mounting accuracy together with the current chip-mount place, in the RAM 156. Step S7 is followed by Step S8 to increment the current number n by adding one. Thus, the current control cycle is ended. When the present control program is executed next, a positive judgment is made at Step S1, because the flag F has been set to F=1. Then, the control skips Steps S2 and S3 and goes to Step S4 and then to Step S5 to S8.

When the control device 150 carries out Step S4 after the CCD camera 82 has taken the respective images of all the standard chips 169 and the control device 150 has determined, and stored, the respective mounting accuracies at all the chip-mount places, a negative judgment is made at Step S4, because the number n is equal to N+1. Hence, the control goes to Step S9 to reset the flag F to F=0 and reset the number n to n=1. Thus, the current control cycle according to the present program is ended.

In the present embodiment, the mounting-accuracy measuring operation is started in response to the command input by the operator through the operation panel 16. However, the mounting-accuracy measuring operation may be automatically carried out periodically. Alternatively, the present EC mounting system may be adapted to detect that the glass plate 170 is set thereon and start, upon detection of setting of the plate 170, the mounting-accuracy measuring operation.

The present EC mounting system starts the mounting-accuracy measuring operation after all the standard chips 169 have been mounted on the glass plate 170. That is, the first CCD camera 82 takes the respective images of the chips 169 mounted on the glass plate 170. Since the chips 169 are mounted on the glass plate 170 in literally the same manner as that in which the ECs 32 are mounted on the PWB 20, the mounting system can accurately measure its mounting accuracy.

However, it is possible that each time one standard chip 169 is mounted at its corresponding chip-mount place on the glass plate 170, an image of the one chip 169 mounted on the plate 170 be taken to measure a mounting accuracy. In this case, the CCD camera 82 takes an image of each chip 169 immediately after the each chip 169 is mounted on the glass plate 170. Therefore, even if there may be some possibility that each chip 169 may be moved out of position on the plate 170, because the chip 169 is not sufficiently fixed to the plate 170, the CCD camera 82 can take an image of each chip 169 before the chip 169 is moved out of position. Thus, the present system can accurately measure its mounting accuracy.

After the present EC mounting system carries out the mounting-accuracy measuring operation, the mounting system corrects, based on the measured mounting accuracy of the mounting system, the control data used to mount the ECs 32 on the PWB 20, so that the corrected control data are used to mount the other ECs 32 on the other PWBs 20.

The present EC mounting system has control data which are used to mount the ECs 32 on the PWB 20. The control data include basic data representing the EC-mount places on the PWB 20 which are assumed to have no positional errors. The basic data are corrected based on the center-position errors $\Delta X$, $\Delta Y$, $\Delta \Theta$ of each EC 32 obtained from the taken image of each EC 32, and the positional errors $\Delta X'$, $\Delta Y'$ of the PWB 20 obtained from the taken images of the positioning F-marks 172. The each EC 32 is mounted on the PWB 20 according to the thus corrected basic data. In the present EC mounting system, the control data or the basic data are corrected, in advance, based on the measured mounting accuracy, and additionally the thus corrected control data are corrected based on the center-position errors $\Delta X$, $\Delta Y$, $\Delta \Theta$ of each EC 32 and the positional errors $\Delta X'$, $\Delta Y'$ of the PWB 20. The each EC 32 is mounted on the PWB 20 according to the thus twice corrected control data or basic data.

As described previously, the mounting accuracies determined by the control device 150 are stored, in the RAM 156, together with the corresponding chip-mount places on the glass plate 170. Therefore, when each EC 32 is mounted at its corresponding EC-mount place on the PWB 20, the control device 150 first finds, from the RAM 156, one of the mounting accuracies that is stored together with the chip-mount place that is near to that EC-mount place, and estimates at least one positional error (i.e., mounting accuracy) at that EC-mount place based on the thus found mounting accuracy. A batch of control data or basic data for that EC-mount place is corrected based on the thus estimated positional error, and the each EC 32 is mounted at that EC-mount place on the PWB 20, according to the thus corrected basic data.

More specifically described, the control device 150 selects one chip-mount place that is the nearest to the EC-mount place where each EC 32 is to be mounted, and corrects the batch of basic data corresponding to the EC-mount place, based on the stored mounting accuracy for the selected chip-mount place. In this case, it is desirable to correct the basic data while taking into account the distance between the EC-mount place and the selected chip-mount place.

Alternatively, it is possible to select, from all the chip-mount places on the jig 170, three chip-mount places which are adjacent to one another, so that those three places cooperate with one another to define a triangle. If one or more EC-mount places where one or more ECs 32 are to be mounted fall within the triangle, the control device 150 estimates a positional error at the EC-mount place or places based on the respective positional errors at the respective vertices of the triangle, and correct the basic data based on the thus estimated positional error or errors.

In the above-described method, the basic data are corrected, in advance, based on the measured mounting accuracy and the thus corrected data are additionally corrected in the conventional manner, that is, based on the center-position errors $\Delta X$, $\Delta Y$ and rotation-position error $\Delta \Theta$ of each EC 32 and the positional errors $\Delta X'$, $\Delta Y'$ of the PWB 20. Thus, the mounting accuracy can be improved. Since the basic data which have been corrected, in advance, based on the measured mounting accuracy are used to mount each EC 32 on the PWB 20, the control device 150 has only to correct the basic data in the conventional manner only when the each EC 32 is actually mounted on the PWB 20. Thus, the mounting accuracy can be improved without having to increase, so much, the amount of calculation of the control device 150.

However, the control data or the basic data may be corrected by the measured mounting accuracy, after the basic data are corrected based on the center-position errors $\Delta X$, $\Delta Y$ and rotation-position error $\Delta \Theta$ of each EC 32 and the positional errors $\Delta X'$, $\Delta Y'$ of the PWB 20, or at the same time as that when the basic data are corrected based on the center-position errors $\Delta X$, $\Delta Y$ and rotation-position error $\Delta \Theta$ of each EC 32, or based on the positional errors $\Delta X'$, $\Delta Y'$ of the PWB 20. Moreover, the basic data may be corrected by the measured mounting accuracy, at the same time as that when the basic data are corrected based on the center-position errors $\Delta X$, $\Delta Y$ and rotation-position error $\Delta \Theta$ of each EC 32 and the positional errors $\Delta X'$, $\Delta Y'$ of the PWB 20.

The present EC mounting system can measure its mounting accuracy immediately after the system is produced in a factory, or at a predetermined period of time. In the latter case, the EC mounting system can deal with the time-wise change of its mounting accuracy caused by the time-wise change of its parts or elements. In the case where the EC mounting system is controlled to measure its mounting accuracy, a plurality of times, during its EC mounting operation, the system can deal with the change of its mounting accuracy caused by the thermal expansion of its parts or elements.

As is apparent from the foregoing description, in the present embodiment, the glass plate 170 provides a jig; the measuring F-marks 174 provide a plurality of first reference marks of the jig; and the main moving device 78 provides each of a first moving device and a second moving device. In the present embodiment, the exclusive standard chips 169 each having standard length, width, and height of a sort of ECs 32 are employed. However, one or more ECs 32 may be used as a sort of standard chips to measure the mounting accuracy of the EC mounting system.

Next, there will be described a second embodiment of the present invention that relates to an EC mounting system 200, shown in FIG. 7. The present EC mounting system 200 employs many elements and the glass plate 170 which are identical with their counterparts employed in the first embodiment shown in FIGS. 1 to 6, and only some elements of the EC mounting system 200 and one or more standard chips 222 (FIG. 8) are different from their counterparts in the first embodiment. Accordingly, only those different elements of the EC mounting system 200 and the standard chips 222 will be described below, and the same reference numeral as used in the first embodiment are used to designate their counterparts and the description thereof is omitted.

The EC mounting system as the first embodiment, shown in FIG. 1, is a "rotatable-body-moving-type" EC mounting system wherein the EC mounting head 80 including the rotatable body 90 holding the ECs 32 is moved along the plane parallel to the upper surface of the PWB 20 which is supported on the PWB supporting device 24 such that the PWB 20 is not moved, so that the ECs 32 are mounted on the PWB 20. In contrast thereto, the EC mounting system 200 as the second embodiment, shown in FIG. 7, includes a base 10 to which columns (not shown) and a stationary table (not shown) are fixed. An EC mounting head 202 is provided on the stationary table. The EC mounting head 202 includes a rotatable body 90 which has a circular cross section and which is supported by the stationary table such that the rotatable body 90 is rotatable about its vertical axis and is not movable along a horizontal plane. The rotatable body 90 supports a plurality of (in the present embodiment, twelve) suction nozzles 100 which are equiangular spaced from each other about the vertical axis line and which extend parallel to that axis line. Each of the suction nozzles 100 is fitted in a corresponding one of the receiving holes formed in the rotatable body 90, such that the each nozzle 100 is rotatable about its vertical axis line relative to the rotatable body 90 and is movable in an axial direction parallel to the vertical axis line of the body 90. As the rotatable body 90 is rotated, each of the suction nozzles 100 is sequentially moved to, and positioned at, an EC-suck position, an EC-image-take position, and an EC-mount position. Each suction nozzle 100 is supplied with a negative air pressure and a positive air pressure via an air-passage defining member, and a switch-valve device 101 supplies and cuts the negative air pressure and the positive air pressure to and from each of the suction nozzles 100. In addition, the EC mounting head 202 supports a first CCD camera 82 (not shown in FIG. 7) such that the first CCD camera 82 is not movable relative to the head 202, and a second CCD camera 84 at a position where the second CCD camera 84 is oriented upward to face the suction nozzle 100 being positioned at the EC-image-take position.

An EC supplying device 26 is provided at a position corresponding to the EC-suck position of the rotatable body 90. Like the two EC supplying devices 26, 28 employed in the first embodiment, the EC supplying device 26 employed in the second embodiment includes a plurality of EC feeders 30. However, in the second embodiment, the EC feeders 30 are supported by a D-axis table 208 which is movable in a D-axis direction parallel to the X-axis direction. Like the X-axis slide 42 in the first embodiment, the D-axis table 208 is provided with a nut and two pairs of guide blocks (all not shown) fixed thereto. The nut is threadedly engaged with a ball screw 210 and the two pairs of guide blocks fit on two guide rails 212, respectively. One of opposite ends of the ball screw 210 is connected to a D-axis servomotor 214, so that the ball screw 210 can be rotated in each of opposite directions. Thus, when the ball screws 210 is rotated, the D-axis table 208 is moved to an arbitrary position in the D-axis direction. The ball screw 210, the guide rails 212, and the D-axis servomotor 214 cooperate with one another to provide a feeder moving device 216 which moves the EC feeders 30.

The feeder moving device 216 moves the D-axis table 206 such that one of the EC feeders 30 that is pre-programmed to supply one EC 32 to the EC mounting head 202 is moved to a position right below the EC-suck position of the rotatable body 90.

A PWB supporting device 204 supports the PWB 20 such that the PWB 20 is movable along a horizontal plane. In the present embodiment, a main moving device 78 moves a Y-axis table 220 which directly supports the PWB 20, relative to the EC mounting head 202 along the horizontal plane. More specifically described, an X-axis table 218 is provided on the base 10 such that the X-axis table 218 is movable in the X-axis direction by an X-axis drive device 52, and the Y-axis table 220 is provided on the X-axis table 218 such that the Y-axis table 220 is movable in the Y-axis direction by a Y-axis drive device 74. Thus, the Y-axis table 220 which supports the PWB 20 is moved relative to the EC mounting head 202 along the horizontal plane.

In the first embodiment, the standard chips 169 are mounted on the glass plate 170 to measure the mounting accuracy of the EC mounting system, shown in FIG. 1. In contrast, in the second embodiment, one or more standard chips 222 are mounted on a glass plate 170 to measure the mounting accuracy of the EC mounting system 200, shown in FIG. 7.

Figure 8:
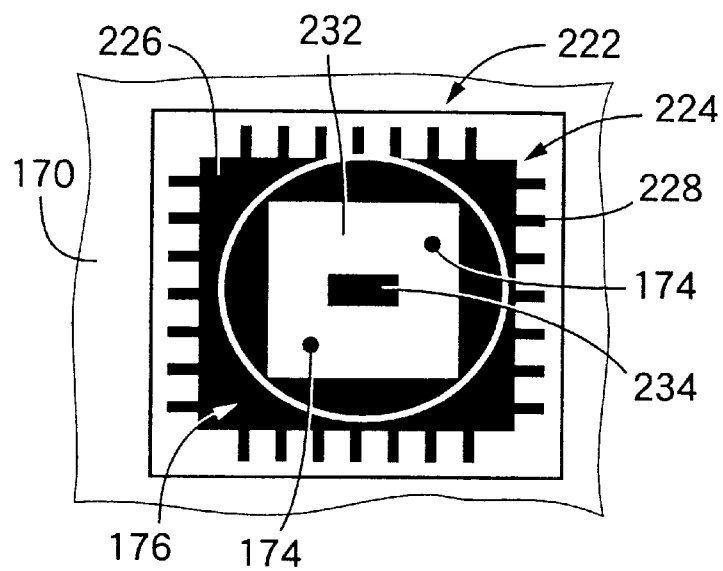
FIG. 8 is a plan view of a standard chip which is used with an EC mounting device of the EC mounting system of FIG. 7 to measure a mounting accuracy thereof.

FIG. 8 shows one standard chip 222 in a state in which the chip 222 is mounted on the glass plate 170. However, only a portion of the glass plate 170 is shown in FIG. 8. The standard chip 222 is formed of a colorless and transparent glass having a linear expansion coefficient of about $0.5 \times 10^{-6}$. In the present embodiment, the chip 222 is formed of quartz glass. The chip 222 has an icon 224, as a positioning reference portion thereof, that is provided on a major surface thereof by printing. An image of the icon 224 that is taken by the second CCD camera 84 is substantially identical with an image, taken by the same 84, of an EC 32 whose size is greater than that of the ECs 32 supplied in the first embodiment. In the present embodiment, the icon 224 has a size or an area greater than that of a field of view 176 of the first CDD camera 82, indicated at a circle in FIG. 8. The printed icon 224 includes a body portion 226 which has a rectangular, frame-like shape with predetermined widths and which enables the second CCD camera 84 to take an image thereof which is substantially identical with an image, taken by the same 82, of a body portion of the EC 32 to be actually supplied. The icon 224 additionally includes a lead-wire portion 228 which enables the second CCD. camera 84 to take an image thereof which is substantially identical with an image, taken by the same 82, of lead wires laterally extending from the side surfaces of the EC 32. The chip 222 has a rectangular, colorless and transparent portion 232 inside the body portion 226 of the icon 224. The colorless and transparent portion 232 provides a light-transmitting portion of the chip 222 which enables the first CCD camera 82 to take an image of a portion of the glass plate 170 through the light-transmitting portion 232 of the chip 222 mounted on the plate 170.

The standard chip 222 additionally has a second reference mark 234 printed at the center of the light-transmitting portion 232. The second reference mark 234 is utilized with the measuring F-marks 174 each as a first reference mark, to measure a mounting accuracy of the EC mounting system 200. The icon 224 and the second reference mark 234 are printed in black. The second reference mark 234 has a rectangular shape which enables the first CCD camera 82 to take an image of the mark 234 that is substantially identical with an image, taken by the same 82, of the standard chip 169 employed in the first embodiment. However, the second reference mark 234 may be one which has a circular shape. In the latter case, if a single circular second reference mark 234 is employed, it is not possible to measure a rotation-position error Θ of the chip 222. Hence, it is preferred that respective images of two or more circular second reference marks 234 be simultaneously taken by the first CDD camera 82.

Next, the operation of the EC mounting system 200 will be described. The EC mounting system 200 mounts one or more standard chips 222 on the glass plate 170, in substantially the same manner as that employed in the first embodiment. Hence, this manner will be briefly described below.

After the EC suction nozzle 100 being positioned at the EC-suck position sucks and holds one standard chip 222, the rotatable body 90 is rotated, so that the nozzle 100 holding the chip 222 is moved to the EC-image-take position where an image of a portion of the icon 224 of the chip 222 is taken by the second CCD camera 84. Thus, the control device 150 calculates respective center-position errors ΔX, ΔY of the chip 222 and a rotation-position error ΔΘ of the same 222. At this time, respective positional errors ΔX', ΔY' of the glass plate 170 have been already calculated by the control device 150 based on respective images of the positioning F-marks 172 of the plate 170 taken by the first CCD camera 82. Then, the nozzle 100 holding the chip 222 is moved to the EC-mount position, while being rotated to eliminate or remove the calculated rotation-position error ΔΘ of the same 222. Concurrently, the chip-mount place on the glass plate 170 is corrected based on the center-position errors ΔX, ΔY of the chip 222 and the positional errors ΔX', ΔY' of the plate 170, and the plate 170 is moved so that the corrected chip-mount place is positioned right below the nozzle 100 being positioned at the EC-mount position and then the chip 222 held by the nozzle 100 is mounted at the corrected chip-mount place on the plate 170.

After the standard chip 222 is mounted on the glass plate 170, the first CCD camera 82 simultaneously takes respective images of the second reference mark 234 of the chip 222 and the two measuring F-marks 174 as the first reference marks, and the control device 150 determines a mounting accuracy of the EC mounting system 200 based on the thus taken images. Since the standard chip 222 is great, the measuring F-marks 174 of the glass plate 170 underlie the chip 222. However, since the chip 222 has the light-transmitting portion 232 as a portion thereof corresponding to the F-marks 174, the first CCD camera 82 can take the respective images of the F-marks 174 underlying the chip 222. Thus, in the second embodiment, too, the first CCD camera 82 can simultaneously take the respective images of the second reference mark 234 of the standard chip 222 and the two measuring F-marks 174 (i.e., the first reference marks) of the glass plate 170, and the control device 150 can measure a highly reliable mounting accuracy of the EC mounting system 200, like in the first embodiment.

Since the standard chip 222 has the rectangular second reference mark 234, the control device 150 can determine not only respective center-position errors ΔX, ΔY of the chip 222 mounted on the glass plate 170 but also the rotation-position error ΔΘ of the chip 222 mounted on the plate 170.

Figure 7:
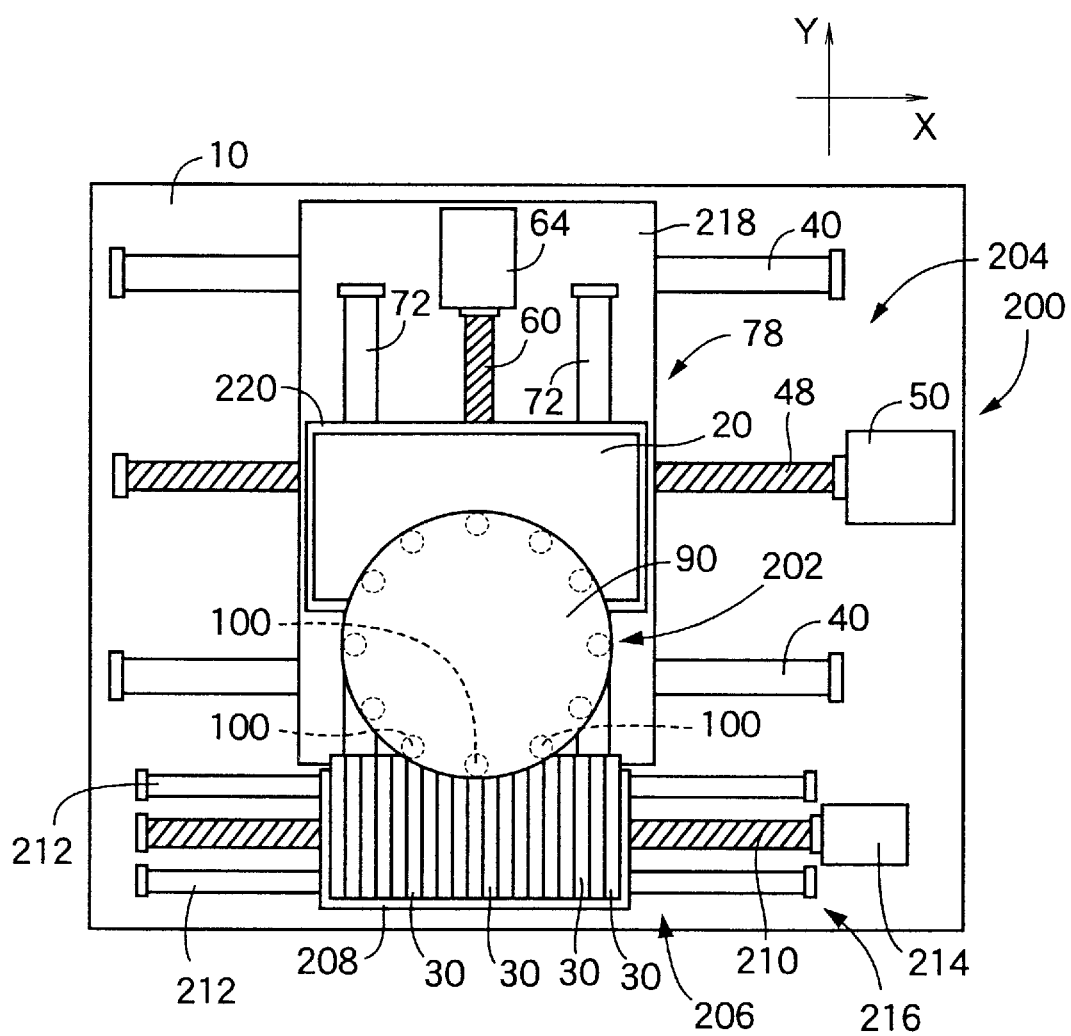
FIG. 7 is a plan view of another EC mounting system to which the present invention is also applied.

The mounting accuracy of the EC mounting system shown in FIG. 1 or the EC mounting system 200 shown in FIG. 7 may be measured by employing both the standard chip or chips 169 and the standard chip or chips 222. The chip 169 and the chip 222 assume different sorts of ECs. In this case, however, a first image of the chip 169 taken by the first CCD camera 82 is substantially identical with a second image of the second reference mark 234 of the chip 222 taken by the same 82. That is, the first and second images have substantially the same shape and dimensions. Therefore, the mounting-accuracy measuring program shown in FIG. 6 can be commonly used, to an advantage, in measuring the mounting accuracy of the EC mounting system 200.

In the case where a single standard chip 222 is mounted at a chip-mount place on the glass plate 170, the control device 150 can determine a mounting accuracy at that chip-mount place on the plate 170; and in the case where two or more standard chip 222 are mounted at respective chip-mount places in a chip-mount area on the glass plate 170 where the EC mounting system 200 is allowed to mount the chips 222, the control device 150 can determine a tendency or distribution of the mounting accuracies in the chip-mount area on the plate 170. In the latter case, the first CCD camera 82 may take all the images needed, after all the standard chips 222 are mounted on the glass plate 170, like in the first embodiment. Alternatively, each time one chip 222 is mounted on the plate 170, the first CCD camera 82 may take images of the second reference mark 234 of the one chip 222 and its corresponding measuring F-marks 174 of the plate 170.

Figure 9:
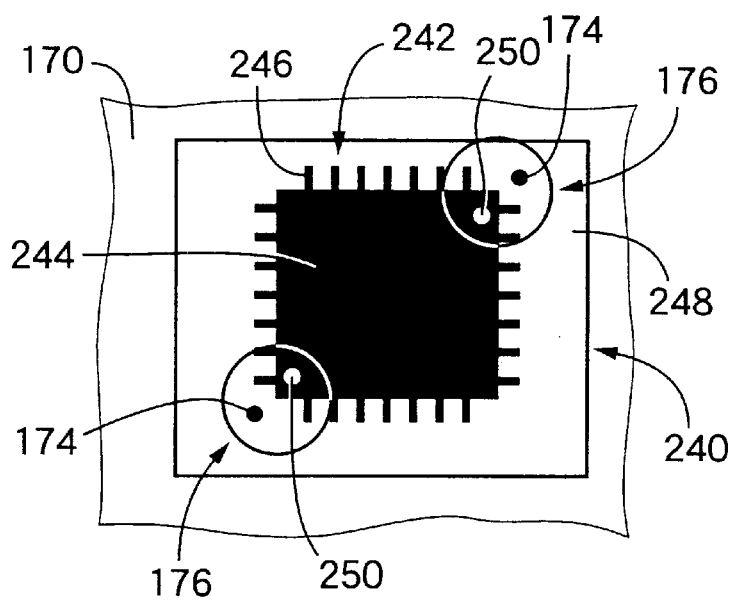
FIG. 9 is a plan view of another standard chip which is used with the EC mounting device of the EC mounting system of FIG. 7 to measure a mounting accuracy thereof.

The standard chip or chips 222 shown in FIG. 8 may be replaced with a standard chip or chips 240 shown in FIG. 9. FIG. 9 shows one standard chip 240 in a state in which the chip 240 is mounted on the glass plate 170 only a portion of which is shown. Like the standard chip 222, the standard chip 240 is formed of a colorless and transparent quartz glass having a linear expansion coefficient of about $0.5 \times 10^{-6}$. The chip 240 has an icon 242 which includes a quadrangular or square body portion 244 which is entirely black so that the second CCD camera 84 may take an image thereof that is substantially identical with an image, taken by the same 84, of a body portion of an EC 32. The icon 242 additionally includes a lead-wire portion 246 which enables the second CCD camera 84 to take an image thereof that is substantially identical with an image, taken by the same 84, of lead wires laterally extending from the side surfaces of the EC 32. The icon 244 is entirely black, i.e., does not includes any light-transmitting portions inside the body portion 244, and the chip 240 has a colorless and transparent, light-transmitting portion 248 outside the icon 242. However, the chip 240 has two second reference marks 250 within the body portion 246 of the icon 242, such that the marks 250 have a color which has a clear contrast to the color (e.g., black) of the body portion 244. In the present embodiment, the second reference marks 250 are colorless and transparent, and are provided at a pair of diagonally opposite corners out of four corners of the square body portion 244.

The glass plate 170 on which the standard chip 240 is to be mounted has two measuring F-marks 174 at respective positions which are near to a chip-mount place where the chip 240 is to be mounted and which are positioned outside the icon 242 in the state in which the chip 240 is mounted on the plate 170. Regarding the glass plate 170 shown in FIG. 9, the two measuring F-marks 174 are provided at respective positions which are outside the icon 242 and around the two corners, respectively, where the two second reference marks 250 are provided.

Since the EC mounting system 200 mounts the standard chip or chips 240 on the glass plate 170, in the same manner as that in which the system 200 mounts the standard chip or chips 222 on the glass plate 170, the description of the manner is omitted.

The manner in which the EC mounting system 200 measures its own mounting accuracy using the standard chip 240 differs from that in which the system 200 does using the standard chip 222, only with respect to the step of taking respective images of the second reference marks 250 provided on the chip 240. Accordingly, only the image taking step will be described below, and the description of the other, common steps is omitted.

On the standard chip 240, the two second reference marks 250 are too far from each other, relative to the size of a circular field of view 176 of the first CCD camera 82, indicated at a circle in FIG. 9. Therefore, the first CCD camera 82 cannot simultaneously take respective images of the two second reference marks 250 and the two measuring F-marks 174 (i.e., the two first reference marks). Hence, in the present embodiment, first, the camera 82 simultaneously takes respective images of one of the two F-marks 174 in one of the two corners and its corresponding second reference mark 250, and then simultaneously takes respective images of the other F-mark 174 in the other corner and its corresponding second reference mark 250. Thus, the camera 82 produces two batches of image data for each chip 240 or each chip-mount place on the glass plate 170, and the control device 150 processes, based on the ideal positional relationship of the two F-marks 174, the two batches of image data into a single batch of image data, which is used to determine a mounting accuracy of the EC mounting system 200.

Thus, in the third embodiment shown in FIG. 9, the single standard chip 240 is divided into two portions from each of which the first CCD camera 82 takes the respective images of one measuring F-mark 174 and one second reference mark 250. Therefore, the EC mounting system 200 can measure its mounting accuracy with respect to the case where the system 200 mounts ECs whose size is too large to fall within the field of view of the first CCD camera 82. Each second reference mark 250 may be provided at any position in an outer peripheral portion of the icon 242, so long as the each reference mark 250 and a portion of the light-transmitting portion 248 (or the corresponding F-mark 174) fall within the field of view of the camera 82. However, in the case where each reference mark 250 is provided near the middle of each side of the square body 244 of the icon 242, the camera 82 would take an image of a more portion of the lead-wire portion 246, as compared with the case where each reference mark 250 is provided near each corner of the square body 244. In the former case, it would be difficult for the computer 160 to distinguish the image of the F-mark 174 and the image of the lead-wire portion 246, from each other, and it would be more likely for the computer 160 to fail to recognize the F-mark 174. In contrast, in the latter case, the camera 82 takes an image of so small a portion of the lead-wire portion 246, that the computer 160 can easily recognize the F-mark 174.

Thus, using the standard chip 240 having the icon 242 larger than the icon 224 of the standard chip 222, the EC mounting system 200 can measure, by dividing the larger icon 242 into two or more portions, its mounting accuracy with respect to the case where the system 200 mounts ECs of a larger size.

Figure 10:
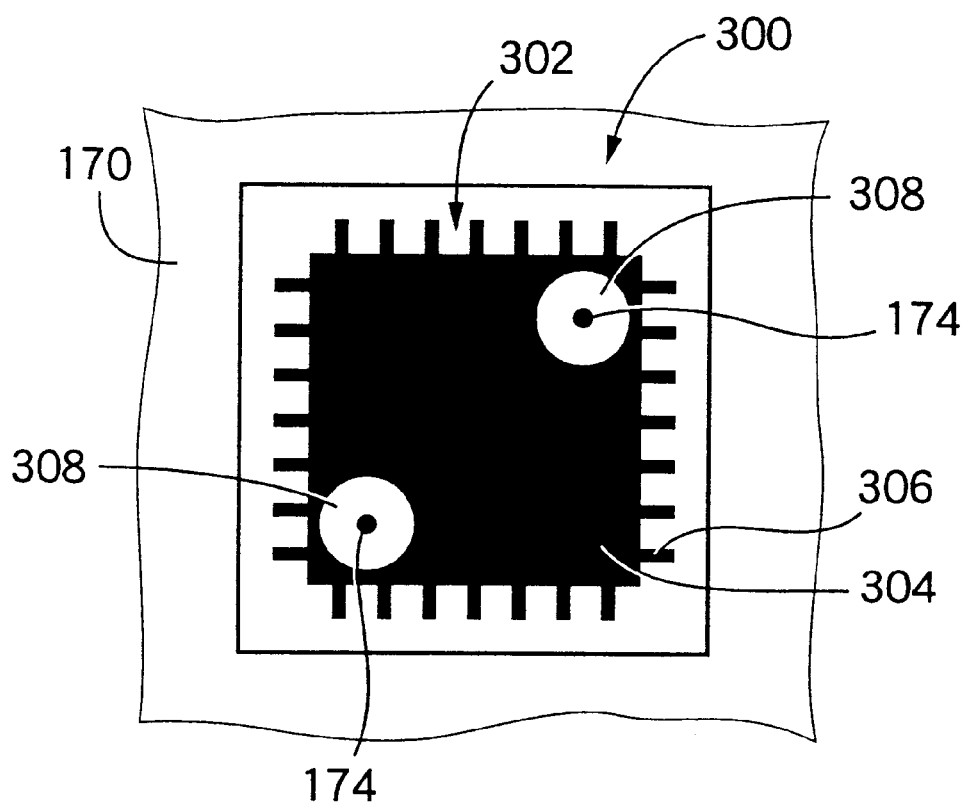
FIG. 10 is a plan view of yet another standard chip which is used with the EC mounting device of the EC mounting system of FIG. 7 to measure a mounting accuracy thereof.

The standard chip or chips 222 shown in FIG. 8 may be replaced with a standard chip or chips 300 shown in FIG. 10. FIG. 10 shows one standard chip 300 in a state in which the chip 300 is mounted on the glass plate 170 only a portion of which is shown. Like the standard chip 240, the standard chip 300 is formed of a colorless and transparent quartz glass having a linear expansion coefficient of about $0.5 \times 10^{-6}$. The chip 300 has an icon 302 which includes a quadrangular or square body portion 304 which is entirely black so that the second CCD camera 84 may take an image thereof that is substantially identical with an image, taken by the same 84, of a body. portion of an EC 32. The icon 302 additionally includes a lead-wire portion 306 which enables the second CCD camera 84 to take an image thereof that is substantially identical with an image, taken by the same 84, of lead wires laterally extending from the side surfaces of the EC 32. The icon 302 has a pair of circular colorless and transparent light-transmitting portions 308 at a pair of diagonally opposite two corners out of four corners of the square body portion 304. The circular light-transmitting portions 308 have a size or diameter which is sufficiently greater than that of the measuring F-marks 174 provided on the glass plate 170. Thus, the second CCD camera 82 can take an image of each measuring F-mark 174 of the plate 170 though the corresponding light-transmitting portion 308 of the chip 300 mounted on the plate 170. That is, the camera 82 can simultaneously take the respective images of the two measuring F-marks 174 and the two light-transmitting portions 308, and the control device 150 can determine, based on the thus obtained images, the X-axis-direction and Y-axis-direction positions and rotation position of the standard chip 300 relative to the glass plate 170. The respective outlines of the light-transmitting portions 308 indicate the positions of the chip 300, and the measuring F-marks 174 indicate the positions of the plate 170. In the present embodiment, the light-transmitting portions 308 also function as the second reference marks of the chip 300.

In the case where the standard chip or chips 300 is or are used to measure a mounting accuracy of the EC mounting system 200, the single CCD camera 82 may simultaneously take the respective images of the two light-transmitting portions 308 of each standard chip 308 and the two measuring F-marks 174 of the glass plate 170, or may first take the respective images of one of the two portions 308 and its corresponding F-mark 174 and then take the respective images of the other portion 308 and its corresponding F-mark 174. In the latter case, the camera 82 produces two batches of image data, and the control device 150 processes those batches of image data and determines, based on the relative positions of the two portions 308 and the corresponding F-marks 174, at least one positional error of the chip 300 relative to the plate 170.

In the fourth embodiment shown in FIG. 10, the second CCD camera 82 can take the respective images of the portions 308 and the F-marks 174, without taking the image of any portions of the lead-wire portion 306 of the icon 302 and, even if the camera 82 may take the image of some portion of the lead-wire portion 406, the computer 160 can neglect that image. Therefore, the computer 160 has only to process a simpler image taken from the chip 300 than the image taken from the chip 240. Thus, the computer 160 can recognize the two light-transmitting portions 308 and the two measuring F-marks 174, with a less amount of calculations.

In the fourth embodiment, the light-transmitting portions 308 as the second reference marks are greater than the second reference marks 250 of the standard chip 240. Therefore, the computer 160 can obtain more image data from the outline of each of the light-transmitting portions 308. Thus, even if one or both of the two portions 308 may be stained or contaminated, the EC mounting system 200 can measure its mounting errors with high accuracy.

The standard chip 300 is used with the EC mounting system 200 to measure its mounting accuracy with respect to the case where the system 200 mounts ECs of a middle size intermediate between the small size of the ECs for which the standard chip 222 is used and the large size of the ECs for which the standard chip 240 is used.

In the second, third, and fourth embodiments shown in FIGS. 7 to 10, each of the icons 224, 242, 302 functions as the positioning reference portion of the corresponding standard chip 222, 240, 300. Each of the icons 224, 242, 302 has the standard dimensions of the corresponding sort of ECs.

In each of the illustrated embodiments, each of the jig 170 and the standard chip 169, 222, 240, 300 may be formed of any material having a linear expansion coefficient of not greater than $20\times10^{-6}$. This coefficient is expressed in terms of degrees Celsius.

While the present invention has been described in its preferred embodiments, the present invention is not limited to the features described in SUMMARY OF INVENTION and the features described in PREFERRED EMBODIMENTS OF INVENTION, but may be embodied with other changes, improvements, and modifications that may occur to a person skilled in the art without departing from the scope and spirit of the invention defined in the appended claims.

What is claimed is:

1. A jig for use in measuring an accuracy with which a mounting device mounts at least one proper member on a proper substrate, the jig being set, in place of the proper substrate, on the mounting device, so that at least one standard chip is mounted on the jig by the mounting device, wherein the improvement comprises that the jig differs from the proper substrate and has, at a plurality of predetermined locations, a plurality of groups of reference marks, respectively, each of which includes at least two reference marks provided at respective predetermined positions which assure that respective to images of said at least two reference marks and an image of at least a portion of the standard chip mounted on the jig are simultaneously taken by a single image taking device, so that said accuracy is determined based on the images taken by the image taking device.

2. A jig according to claim 1, wherein the jig has, at at least four predetermined locations, at least four groups of reference marks, respectively, each of which includes at least two reference marks, said at least four locations comprising four corners of a mount area on the jig where said at least one standard chip is mounted by the mounting device.

3. A jig according to claim 2, wherein the jig has, in addition to said at least four groups of reference marks, at least one additional group of reference marks, such that at least three groups of reference marks out of (a) said at least four groups of reference marks and (b) said at least one additional group of reference marks are provided at a regular interval of distance in the mount area on the jig.

4. A jig according to claim 3, wherein (a) said at least four groups of reference marks and (b) said additional groups of reference marks are substantially uniformly distributed in the substantially entire mount area on the jig.

5. A jig according to claim 1, wherein the jig has, in addition to said plurality of groups of reference marks as a plurality of first reference marks, a plurality of second reference marks, such that the first reference marks are provided at respective predetermined positions relative to the second reference marks.

6. A jig for use in measuring an accuracy with which a mounting device mounts at least one proper member on a proper substrate, the jig being set, in place of the proper substrate, on the mounting device, so that at least one standard chip is mounted on the jig by the mounting device, wherein the improvements comprise that the jig differs from the proper substrate and has at least two reference marks at respective predetermined positions which assure that respective images of the reference marks and an image of at least a portion of the standard chip mounted on the jig are simultaneously taken by a single image taking device, so that said accuracy is determined based on the images taken by the image taking device, and that the jig is formed of a material which has a linear expansion coefficient of not more than $5\times10^{-6}$.

7. A standard chip for use in measuring an accuracy with which a mounting device mounts at least one proper member on a proper substrate, a jig having at least two first reference marks being set, in place of the proper substrate, on the mounting device, so that the standard chip is mounted on the jig by the mounting device, the standard chip comprising:

at least one positioning reference portion which is utilized by the mounting device to position the standard chip relative to the jig, when the standard chip is mounted on the jig by the mounting device;

at least one second reference mark provided at at least one predetermined position which assures that respective images of the first reference marks of the jig and an image of the second reference mark of the standard chip mounted on the jig are simultaneously taken by an image taking device, so that said accuracy is determined based on the images taken by the image taking device; and a light-transmitting portion which enables the image taking device to take, in a state in which the standard chip is mounted on the jig, the images of the first reference marks of the jig through the light-transmitting portion of the standard chip.

8. A standard chip according to claim 7, wherein the light-transmitting portion of the standard chip is formed of a transparent material.

9. A standard chip according to claim 7, wherein the positioning reference portion of the standard chip comprises a standard icon which enables an image taking device to take an image of the standard icon which is substantially identical with an image, taken by the image taking device, of a positioning reference portion of the proper member.

10. A standard chip according to claim 9, wherein the standard icon has an outline which enables the image taking device to take an image of the outline which is substantially identical with an image, taken by the image taking device, of a plurality of lead wires projecting laterally from at least one side surface of an electric component as the proper member.

11. A standard chip according to claim 7, wherein the standard chip has the second reference mark at the position in the light-transmitting portion thereof, such that the second reference mark of the standard chip mounted on the jig does not overlap the first reference marks of the jig.

12. A standard chip according to claim 11, wherein the standard chip has the light-transmitting portion thereof inside the positioning reference portion thereof.

13. A standard chip according to claim 11, wherein the standard chip has the light-transmitting portion thereof outside the positioning reference portion thereof.

14. A standard chip according to claim 7, wherein the standard chip has the second reference mark in the positioning reference portion thereof, at the position which assures that the respective images of the first reference marks of the jig and the image of the second reference mark of the standard chip mounted on the jig are simultaneously taken by the image taking device.

15. A standard chip according to claim 7, wherein the second reference mark of the standard chip has a rectangular shape.

16. A standard chip according to claim 7, wherein the second reference mark of the standard chip has a circular shape.

17. A standard chip according to claim 16, wherein the standard chip has a plurality of second reference marks each of which has a circular shape.

18. A standard chip according to claim 7, wherein the standard chip is formed of a material which has a linear expansion coefficient of not more than $20 \times 10^{-6}$.

19. A jig set for use in measuring an accuracy with which a mounting device mounts at least one proper member on a proper substrate, the jig set comprising:

a jig which differs from the proper substrate and which is adapted to be set, in place of the proper substrate, on the mounting device; and at least one standard chip which differs from the proper member and which is mounted on the jig by the mounting device, wherein the jig has, at a plurality of predetermined locations, a plurality of groups of reference marks, respectively, each of which includes at least two reference marks provided at respective predetermined positions which assure that respective images of said at least two reference marks and an image of at least a portion of the standard chip mounted on the jig are simultaneously taken by an image taking device, so that said accuracy is determined based on the images taken by the image taking device, wherein the jig is formed of a material which has a linear expansion coefficient of not more than $5 \times 10^{-6}$.

20. A jig set according to claim 19, wherein the jig has, at at least six predetermined locations, at least six groups of reference marks each of which includes at least two reference marks, and which are substantially uniformly distributed in a mount area on the jig where said at least one standard chip is mounted by the mounting device.

21. A method of mounting, with a mounting device each of a plurality of proper members on a proper substrate, the method comprising the steps of:

mounting, with the mounting device, and before the mounting device mounts the proper members on the proper substrate, at least one proper member on a jig which differs from the proper substrate and has at least two reference marks at respective predetermined positions which assure that respective images of the reference marks and an image of at least a portion of the proper member mounted on the jig are simultaneously taken by an image taking device, simultaneously taking, with the image taking device, the respective images of the reference marks of the jig and the image of said portion of the proper member mounted on the jig, processing, with an image-data processing device, image data representing the images taken by the image taking device, to determine respective relative positions of the proper member relative to the reference marks of the jig and determine, based on the determined relative positions, at least one positional error of the proper member mounted on the jig by the mounting device, and mounting, with the mounting device, said each of the proper members on the proper substrate, without said at least one positional error.

22. A method of mounting, with a mounting device, each of a plurality of proper members on a proper substrate, the method comprising the steps of:

mounting, with the mounting device, and before the mounting device mounts the proper members on the proper substrate, at least one standard chip, on a jig which differs from the proper substrate and has at least two first reference marks at respective predetermined positions which assure that respective images of the first reference marks and an image of at least a portion of the standard chip mounted on the jig are simultaneously taken by an image taking device, the standard chip differing from said each proper member, having at least one positioning reference portion which is utilized by the mounting device to position the standard chip relative to the jig, when the standard chip is mounted on the jig by the mounting device, and additionally having at least one second reference mark at at least one predetermined position which assures that the respective images of the first reference marks of the jig and an image of the second reference mark of the standard chip mounted on the jig are simultaneously taken by the image taking device, simultaneously taking, with the image taking device, the respective images of the first reference marks of the jig and the image of the second reference mark of the standard chip mounted on the jig, and processing, with an image-data processing device, image data representing the images taken by the image taking device, to determine respective relative positions of the second reference mark relative to the first reference marks of the jig and determine, based on the determined relative positions, at least to one positional error of the standard chip mounted on the jig by the mounting device, and mounting, with the mounting device, said each of the proper members on the proper substrate, without said at least one positional error.

23. A recording medium in which an accuracy measuring program is recorded such that the program is readable by a computer to measure an accuracy with which a mounting device mounts each of a plurality of proper members on a proper substrate, before the mounting device mounts the proper members on the proper substrate, the program comprising the steps of:

controlling, before the mounting device mounts the proper members on the proper substrate, the mounting device to mount at least one standard chip which differs from said each proper member, on a jig which differs from the proper substrate and has at least two first reference marks at respective predetermined positions which assure that respective images of the first reference marks and an image of at least a portion of the standard chip mounted on the jig are simultaneously taken by a single image taking device, controlling the single image taking device to take simultaneously the respective images of the first reference marks of the jig and the image of said portion of the standard chip mounted on the jig, and controlling an image-data processing device to process image data representing the images taken by the image taking device, to determine respective relative positions of the standard chip relative to first the reference marks of the jig and determine, based on the determined relative positions, at least one positional error of the standard chip mounted on the jig by the mounting device.

24. A recording medium according to claim 23, wherein the step of controlling the mounting device comprises controlling the mounting device to mount, on said jig, said at least one standard chip which has at least one positioning reference portion which is utilized by the mounting device to position the standard chip relative to the jig, when the standard chip is mounted on the jig by the mounting device, and additionally has at least one second reference mark at at least one predetermined position which assures that the respective images of the first reference marks of the jig and an image of the second reference mark of the standard chip mounted on the jig are simultaneously taken by the single image taking device, wherein the step of controlling the image taking device comprises controlling the image taking device to take simultaneously the respective images of the first reference marks of the jig and an image of the second reference mark of the standard chip mounted on the jig, and wherein the step of controlling the image-data processing device comprises controlling the image-data processing device to processes image data representing the images taken by the image taking device, to determine respective relative positions of the second reference mark relative to the first reference marks of the jig and determine, based on the determined relative positions, at least one positional error of the standard chip mounted on the jig by the mounting device.

25. A mounting apparatus for mounting a plurality of proper members on a proper substrate, comprising:

at least one holder which holds each of said proper members;

a supporting device which supports the proper substrate;

a first moving device which moves at least one of the holder and the supporting device relative to the other of the holder and the supporting device;

a control device which controls, according to prescribed control data, the first moving device so that said each proper member held by the holder is mounted on the proper substrate supported by the supporting device;

an image taking device having a field of view through which the image taking device can take an image of a local portion of the proper substrate supported by the supporting device;

a second moving device which moves at least one of the supporting device and the image taking device relative to the other of the supporting device and the image taking device;

a jig which differs from the proper substrate and which is supported, in place of the proper substrate, by the supporting device, the control device controlling, according to the prescribed control data, the first moving device so that at least one standard is chip, which differs from said each proper member and which is held by said at least one holder, is mounted on the jig supported by the supporting device, the jig having at least two first reference marks at respective predetermined positions which assure that respective images of the first reference marks and an image of at least a portion of the standard chip mounted on the jig are simultaneously taken by the image taking device, the control device controlling the image taking device to take simultaneously the respective images of the first reference marks and the image of said portion of the standard chip mounted on the jig;

an image-data processing device which processes image data representing the images taken by the image taking device, and determines at least one positional error of the standard chip mounted on the jig by the mounting device; and a correcting device which corrects the prescribed control data based on said at least one positional error determined by the image-data processing device, the controlling device controlling, according to the corrected control data, the first moving device so that said each proper member held by the holder is mounted on the proper substrate without said at least one positional error.

26. A mounting apparatus according to claim 25, further comprising a memory which stores said at least one positional error determined by the image-data processing device, wherein the correcting device corrects the prescribed control data based on the positional error stored in the memory.

27. A mounting apparatus according to claim 25, further comprising: a correction-amount determining device which determines, based on said at least one positional error determined by the image-data processing device, at least one correction amount for correcting said at least one positional error; and a memory which stores said at least one correction amount determined by the correction-amount determining device, wherein the correcting device corrects the prescribed control data based on the correction amount stored in the memory.

28. A mounting apparatus according to claim 25, wherein said at least one holder mounts each of a plurality of electric components as said plurality of proper members, on a printed wiring board as the proper substrate.

* * * * *